US012660339B2

(12) United States Patent
Hsu

(10) Patent No.: US 12,660,339 B2
(45) Date of Patent: Jun. 16, 2026

(54) STACKED CMOS IMAGE SENSOR

(71) Applicant: Taiwan Semiconductor Manufacturing Company, Ltd., Hsinchu (TW)

(72) Inventor: Tzu-Hsuan Hsu, Kaohsiung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 883 days.

(21) Appl. No.: 17/749,457

(22) Filed: May 20, 2022

(65) Prior Publication Data

US 2023/0268372 A1 Aug. 24, 2023

Related U.S. Application Data

(60) Provisional application No. 63/312,184, filed on Feb. 21, 2022.

(51) Int. Cl.
*H10F 39/18* (2025.01)
*H10F 39/00* (2025.01)
(52) U.S. Cl.
CPC ........... *H10F 39/18* (2025.01); *H10F 39/014* (2025.01); *H10F 39/811* (2025.01)
(58) Field of Classification Search
None
See application file for complete search history.

(56) References Cited

U.S. PATENT DOCUMENTS 12,495,626 B2 * 12/2025 Lee ........................ H10F 39/802
12,495,627 B2 * 12/2025 Jin ....................... H10F 39/8033

| | | | |
|---|---|---|---|
| 2004/0217394 A1 | 11/2004 | Lee | |
| 2009/0189233 A1 * | 7/2009 | Liu | H10F 39/024 |
| | | | 257/E31.127 |
| 2013/0037890 A1 * | 2/2013 | Tseng | H10F 39/014 |
| | | | 257/411 |
| 2013/0285180 A1 | 10/2013 | Wang et al. | |
| 2014/0042298 A1 | 2/2014 | Wan et al. | |
| 2014/0138847 A1 | 5/2014 | Jeon | |
| 2014/0231887 A1 * | 8/2014 | Chen | H10F 71/00 |
| | | | 438/64 |

(Continued)

FOREIGN PATENT DOCUMENTS

| | | |
|---|---|---|
| CN | 112866595 A | 5/2021 |
| JP | 2018160667 A | 10/2018 |

*Primary Examiner* — Steven B Gauthier
*Assistant Examiner* — E. Rhett Cheek
(74) *Attorney, Agent, or Firm* — Eschweiler & Potashnik, LLC

(57) ABSTRACT

Various embodiments of the present disclosure are directed towards a stacked complementary metal-oxide semiconductor (CMOS) image sensor in which a pixel sensor spans multiple integrated circuit (IC) chips and has only a first gate dielectric thickness at a first IC chip at which a photodetector of the of the pixel sensor is arranged. Further, the pixel sensor has only one or more second gate dielectric thicknesses at a second IC chip that is stacked with the first IC chip, and the one or more second gate dielectric thicknesses is/are less than or equal to the first gate dielectric thickness. The first and second gate dielectric thicknesses correspond to transistors of the pixel sensor, which form a pixel circuit of the pixel sensor configured to facilitate readout of the photodetector.

20 Claims, 30 Drawing Sheets

(56) References Cited

U.S. PATENT DOCUMENTS

| | | | |
|---|---|---|---|
| 2015/0028402 A1 | 1/2015 | Chou et al. | |
| 2016/0020235 A1* | 1/2016 | Yamashita | H10F 39/811 |
| | | | 250/206 |
| 2016/0056196 A1* | 2/2016 | Li | H10F 39/199 |
| | | | 257/435 |
| 2017/0062506 A1 | 3/2017 | Saito | |
| 2017/0194372 A1* | 7/2017 | Ha | H04N 25/78 |
| 2018/0240797 A1 | 8/2018 | Yokoyama et al. | |
| 2019/0131332 A1* | 5/2019 | Lee | H04N 25/70 |
| 2019/0131336 A1* | 5/2019 | Yoon | H10F 39/191 |
| 2019/0267423 A1 | 8/2019 | Lee et al. | |
| 2020/0258924 A1 | 8/2020 | Takachi et al. | |
| 2020/0386620 A1 | 12/2020 | Toda | |
| 2021/0084249 A1 | 3/2021 | Nakazawa et al. | |
| 2021/0159265 A1 | 5/2021 | Jang | |
| 2022/0271070 A1 | 8/2022 | Nakazawa et al. | |
| 2023/0197756 A1* | 6/2023 | Lee | H10F 39/807 |
| | | | 257/292 |

* cited by examiner

500

600

1600C

1800

1900A

3000

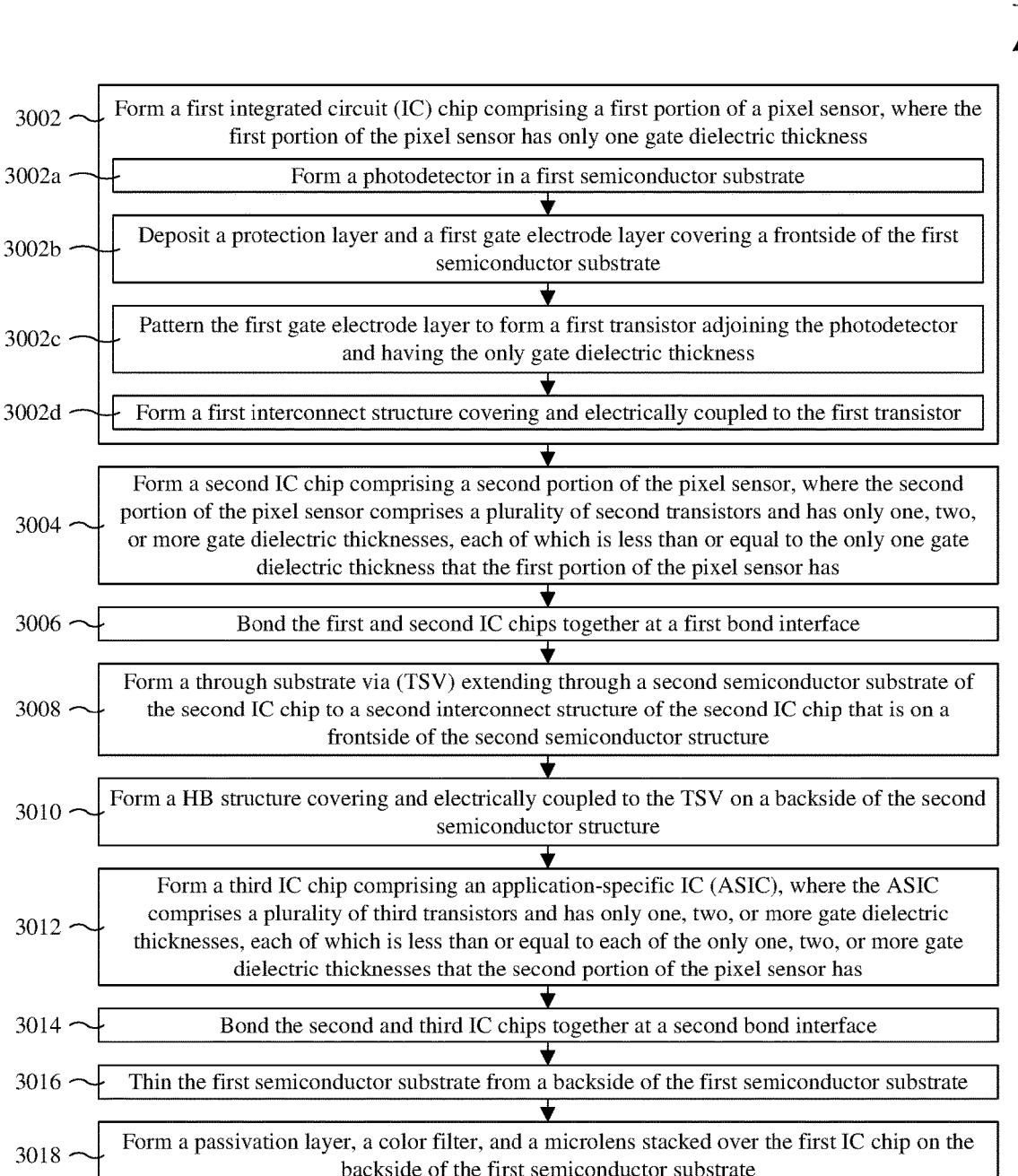

3002 — Form a first integrated circuit (IC) chip comprising a first portion of a pixel sensor, where the first portion of the pixel sensor has only one gate dielectric thickness 3002a — Form a photodetector in a first semiconductor substrate 3002b — Deposit a protection layer and a first gate electrode layer covering a frontside of the first semiconductor substrate 3002c — Pattern the first gate electrode layer to form a first transistor adjoining the photodetector and having the only gate dielectric thickness 3002d — Form a first interconnect structure covering and electrically coupled to the first transistor 3004 — Form a second IC chip comprising a second portion of the pixel sensor, where the second portion of the pixel sensor comprises a plurality of second transistors and has only one, two, or more gate dielectric thicknesses, each of which is less than or equal to the only one gate dielectric thickness that the first portion of the pixel sensor has 3006 — Bond the first and second IC chips together at a first bond interface 3008 — Form a through substrate via (TSV) extending through a second semiconductor substrate of the second IC chip to a second interconnect structure of the second IC chip that is on a frontside of the second semiconductor structure 3010 — Form a HB structure covering and electrically coupled to the TSV on a backside of the second semiconductor structure 3012 — Form a third IC chip comprising an application-specific IC (ASIC), where the ASIC comprises a plurality of third transistors and has only one, two, or more gate dielectric thicknesses, each of which is less than or equal to each of the only one, two, or more gate dielectric thicknesses that the second portion of the pixel sensor has 3014 — Bond the second and third IC chips together at a second bond interface 3016 — Thin the first semiconductor substrate from a backside of the first semiconductor substrate 3018 — Form a passivation layer, a color filter, and a microlens stacked over the first IC chip on the backside of the first semiconductor substrate

Fig. 30

STACKED CMOS IMAGE SENSOR

REFERENCE TO RELATED APPLICATION

This Application claims the benefit of U.S. Provisional Application No. 63/312,184, filed on Feb. 21, 2022, the contents of which are incorporated by reference in their entirety.

BACKGROUND

Integrated circuits (ICs) with image sensors are used in a wide range of modern-day electronic devices, such as, for example, cameras, cell phones, and the like. Types of image sensors include, for example, complementary metal-oxide semiconductor (CMOS) image sensors and charge-coupled device (CCD) image sensors. Compared to CCD image sensors, CMOS image sensors are increasingly favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 30 illustrates a block diagram of some embodiments of the method of FIGS. 18, 19A, 19B, 20, 21, 22A, 22B, 23A, 23B, 24-26, 27A, 27B, 28A, 28B, and 29.

DETAILED DESCRIPTION

Figure 1:
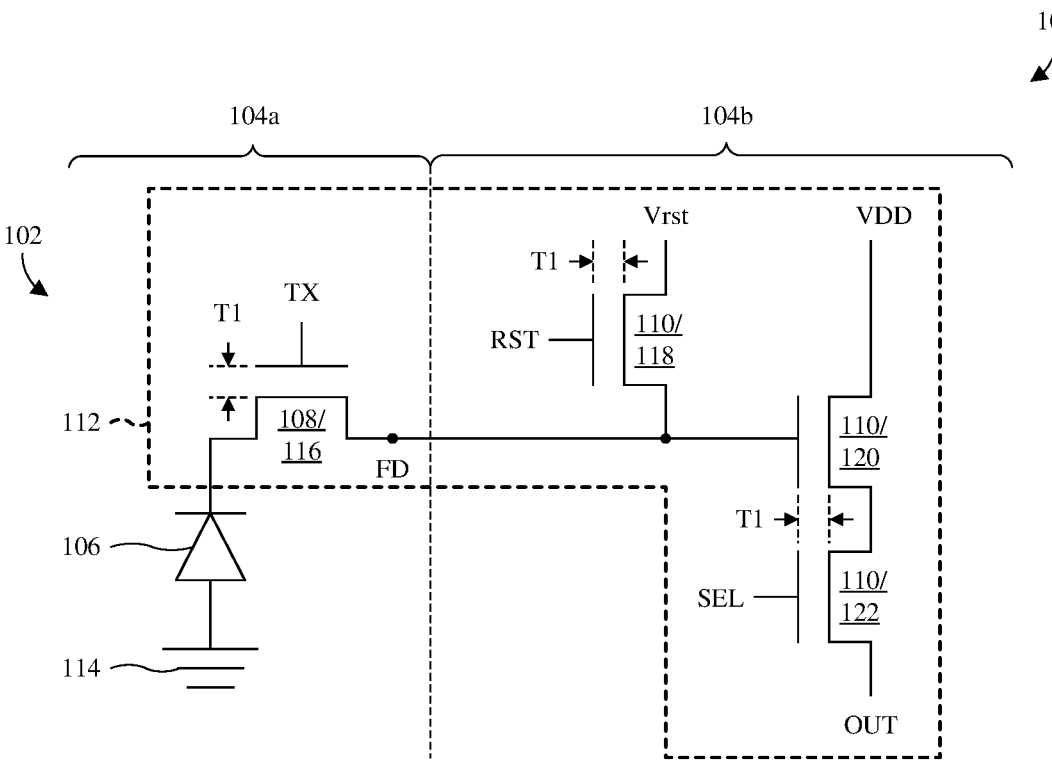
FIG. 1 illustrates a circuit diagram of some embodiments of a stacked complementary metal-oxide semiconductor (CMOS) image sensor in which a pixel sensor spans multiple integrated circuit (IC) chips.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked complementary metal-oxide semiconductor (CMOS) image sensor may comprise a first integrated circuit (IC) chip and a second IC chip that are stacked. The first IC chip accommodates a pixel sensor that repeats in a grid pattern, and the second IC chip accommodates an application-specific IC (ASIC) that is electrically coupled to the pixel sensor and each repetition of the pixel sensor. The pixel sensor comprises a photodetector and a pixel circuit that are localized to the first IC chip. The photodetector is configured accumulate charge in response to incident radiation. The pixel circuit is configured to facilitate readout of the accumulated charge and comprises a plurality of transistors.

The semiconductor manufacturing industry continuously seeks to scale down image sensors to achieve lower fabrication costs, higher device integration density, higher speeds, better performance, and so on. However, scaling down the transistors of the pixel circuit may be challenging. For example, the transistors of the pixel circuit may have different gate dielectric thicknesses, which increases the complexity of forming the transistors and hence increases the difficulty of scaling down the transistors. Because scaling down the transistors of the pixel circuit may be challenging, the photodetector may instead be scaled down and hence performance of the pixel sensor may be degraded.

Various embodiments of the present disclosure are directed towards a stacked CMOS image sensor in which a pixel sensor spans multiple IC chips and has only a first gate dielectric thickness at a first IC chip at which a photodetector of the of the pixel sensor is arranged. Further, the pixel sensor has only one or more second gate dielectric thicknesses at a second IC chip that is stacked with the first IC chip, and the one or more second gate dielectric thicknesses is/are less than or equal to the first gate dielectric thickness. The first and second gate dielectric thicknesses correspond to transistors of the pixel sensor, which form a pixel circuit of the pixel sensor configured to facilitate readout of the photodetector.

Because the pixel sensor is spread across the first and second IC chips, the pixel sensor has fewer transistors at the first IC chip than it would otherwise have. This, in turn, allows the pixel sensor to be scaled down at the first IC chip without scaling down the photodetector. Further, because the pixel sensor has only one gate dielectric thickness at the first IC chip, complexity of forming a first transistor of the pixel sensor at the first IC chip is reduced compared to what it would otherwise be. As such, the first transistor of the pixel sensor may be more readily scaled down. This, in turn, further allows the pixel sensor to be scaled down at the first IC chip without scaling down the photodetector.

Because the photodetector is relatively large and is at the first IC chip, but not at the second IC chip, the portion of the pixel sensor at the first IC chip may be what limits scaling down of the pixel sensor. Hence, the portion of the pixel sensor at the second IC chip may have unused space. This unused space may be used for additional functionality. Additionally, scaling down the pixel sensor at the first IC chip may have the effect of scaling down the entire pixel sensor. Because the pixel sensor may be scaled down without scaling down the photodetector, as described above, performance of the pixel sensor may be high even at small sizes.

With reference to FIG. 1, a circuit diagram 100 of some embodiments of a stacked CMOS image sensor comprising a pixel sensor 102 is provided. The pixel sensor 102 spans a first IC chip 104a and a second IC chip 104b that are stacked. The first and second IC chips 104a, 104b are shown as being laterally stacked, but may alternatively be vertically stacked. The pixel sensor 102 may, for example, be a four-transistor (4T) CMOS active pixel sensor (APS) or the like, and/or may, for example, also be known as a pixel.

The pixel sensor 102 has only one gate dielectric thickness, a first gate dielectric thickness T1, at the first IC chip 104a, which accommodates a photodetector 106 of the pixel sensor 102. Further, the pixel sensor 102 has only one gate dielectric thickness, the first gate dielectric thickness T1, at the second IC chip 104b. Hence, the only one gate dielectric thickness at the second IC chip 104b is equal to the only one gate dielectric thickness at the first IC chip 104a. In alternative embodiments, the only one gate dielectric thickness at the second IC chip 104b is less than the only one gate dielectric thickness at the first IC chip 104a. In alternative embodiments, the pixel sensor 102 has only two gate dielectric thicknesses or some other suitable number of gate dielectric thicknesses at the second IC chip 104b, each of which is less than or equal to the only one gate dielectric thickness at the first IC chip 104a.

A first transistor 108 is in the first IC chip 104a and has the first gate dielectric thickness T1. Further, a plurality of second transistors 110 is in the second IC chip 104b and each of the second transistors 110 individually has the first gate dielectric thickness T1. The first and second transistors 108, 110 form a pixel circuit 112 spanning the first and second IC chips 104a, 104b and configured to facilitate readout of the photodetector 106.

Because the pixel sensor 102 is spread across the first and second IC chips 104a, 104b, the pixel sensor 102 has fewer transistors at the first IC chip 104a than it would otherwise have. For example, instead of having four transistors at the first IC chip 104a, the pixel sensor 102 may only have one transistor at the first IC chip 104a. This, in turn, allows the pixel sensor 102 to be scaled down at the first IC chip 104a without scaling down the photodetector 106. Further, because the pixel sensor 102 has only one gate dielectric thickness (e.g., the first gate dielectric thickness T1) at the first IC chip 104a, the complexity of forming the first transistor 108 is reduced compared to what it would otherwise be. As such, the first transistor 108 may be more readily scaled down. This, in turn, further allows the pixel sensor 102 to be scaled down at the first IC chip 104a without scaling down the photodetector 106.

Because the photodetector 106 is relatively large and is at the first IC chip 104a, but not at the second IC chip 104b, the portion of the pixel sensor 102 at the first IC chip 104a may be what limits scaling down of the pixel sensor 102. Hence, scaling down the pixel sensor 102 at the first IC chip 104a may have the effect of scaling down an entirety of the pixel sensor 102. Because the pixel sensor 102 may be scaled down without scaling down the photodetector 106, as described above, performance of the pixel sensor 102 may be high even at small sizes.

With continued reference to FIG. 1, the photodetector 106 is a photodiode and is electrically coupled from ground 114 to the first transistor 108. An anode of the photodetector 106 is electrically coupled to ground 114, and a cathode of the photodetector 106 is electrically coupled to the first transistor 108. In alternative embodiments, the photodetector 106 is a type of photodetector other than a photodiode. The first transistor 108 is more specifically a transfer transistor 116 gated by a transfer signal TX and is configured to selectively transfer charge that accumulates at the photodetector 106 to a floating diffusion node FD.

The second transistors 110 comprise a reset transistor 118, a source-follower transistor 120, and a select transistor 122. The reset transistor 118 is gated by a reset signal RST and is electrically coupled from a reset voltage Vrst to the floating diffusion node FD. Further, the reset transistor 118 is configured to clear accumulated charge at the floating diffusion node FD by electrically coupling the floating diffusion node FD to the reset voltage Vrst. When the transfer transistor 116 is ON, this electrical coupling by the reset transistor 118 may also clear accumulated charge at the photodetector 106.

The source-follower transistor 120 is gated by charge at the floating diffusion node FD. For example, the gate of the source-follower transistor 120 may be electrically shorted to the floating diffusion node FD and/or a source/drain region of the transfer transistor 116. Further, the select transistor 122 is gated by a select signal SEL. The source-follower transistor 120 and the select transistor 122 are electrically coupled in series from a power supply voltage VDD to an output OUT of the pixel sensor 102. The source-follower transistor 120 is configured to buffer and amplify a voltage at the floating diffusion node FD for non-destructively reading the voltage. The select transistor 122 is configured to selectively pass a buffered and amplified voltage from the source-follower transistor 120 to the output OUT.

In some embodiments, the image sensor has only one gate dielectric thickness at the first IC chip 104a and/or has only one or two gate dielectric thickness at the second IC chip 104b. For example, all transistors on the first IC chip 104a may individually have the first gate dielectric thickness T1 and/or all transistors on the second IC chip 104b may individually have the first gate dielectric thickness T1. Further, in some embodiments, each gate dielectric thickness of the second IC chip 104b is less than or equal to each gate dielectric thickness of the first IC chip 104a. For example, all transistors on the first IC chip 104a may individually have the first gate dielectric thickness T1 and all transistors on the second IC chip 104b may each have a gate dielectric thickness less than or equal to the first gate dielectric thickness T1.

In at least some embodiments, gate dielectric thickness as used above and hereafter refers to a separation between a gate electrode of a corresponding transistor and a semiconductor channel of the corresponding transistor. Such separation is achieved by a gate dielectric layer of the corresponding transistor, whereby gate dielectric thickness also refers to a thickness of the gate dielectric layer. The corresponding transistor may, for example, correspond to any of the first and second transistors 108, 110. In some embodiments, the first and second transistors 108, 110 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing.

Figure 2:
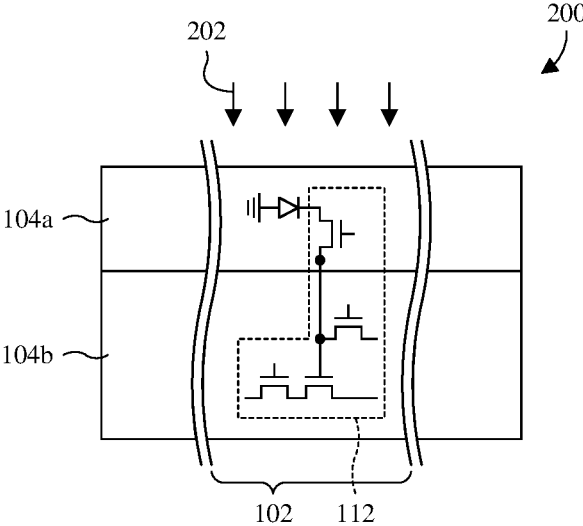
FIG. 2 illustrates a schematic cross-sectional view of some embodiments of the image sensor of FIG. 1.

With reference to FIG. 2, a schematic cross-sectional view 200 of some embodiments of the image sensor of FIG. 1 is provided in which the first and second IC chips 104a, 104b are vertically stacked. The first IC chip 104a overlies the second IC chip 104b, and the image sensor is configured to receive radiation 202 from a top of the image sensor.

With reference to FIGS. 3A-3D, circuit diagrams 300A-300D of some alternative embodiments of the image sensor of FIG. 1 are provided in which gate dielectric thicknesses of the second transistors 110 are varied.

Figure 3A:
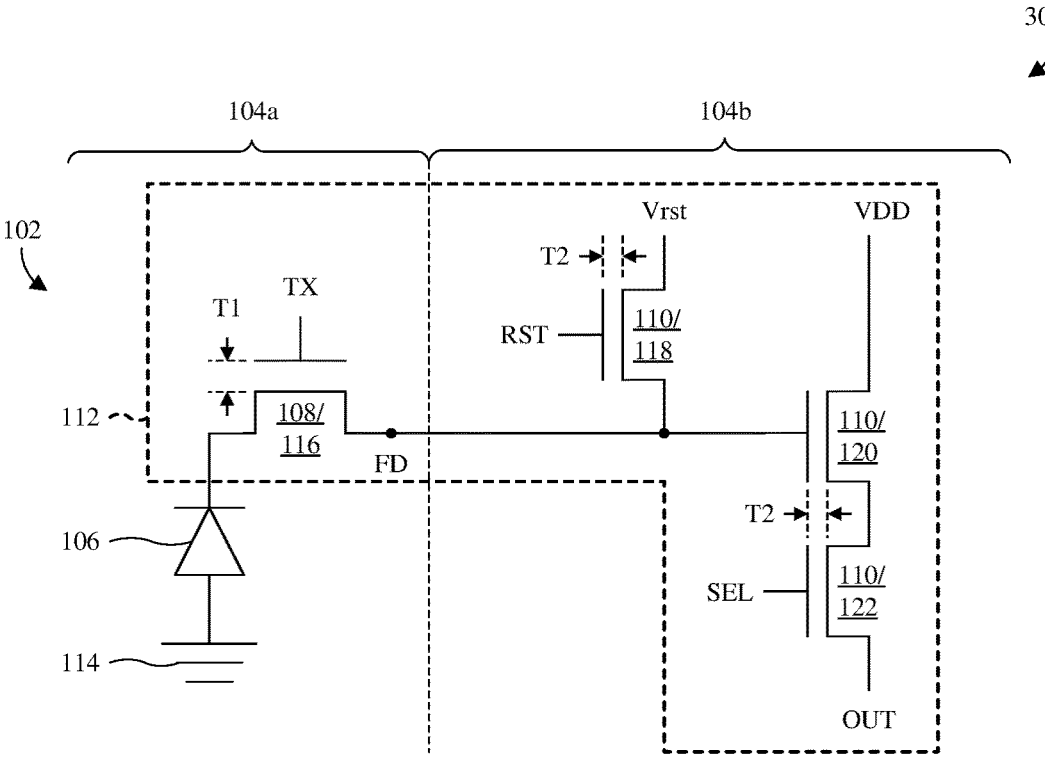
FIGS. 3A-3C illustrate circuit diagrams of some alternative embodiments of the image sensor of FIG. 1 in which gate dielectric thicknesses are varied.

At FIG. 3A, the pixel sensor 102 has only one gate dielectric thickness at the second IC chip 104b as in FIG. 1. However, in contrast with FIG. 1, this gate dielectric thickness is a second gate dielectric thickness T2, which is less than the first gate dielectric thickness T1 that the pixel sensor 102 has at the first IC chip 104a. Accordingly, each of the second transistors 110 individually has the second gate dielectric thickness T2.

Figure 3B:
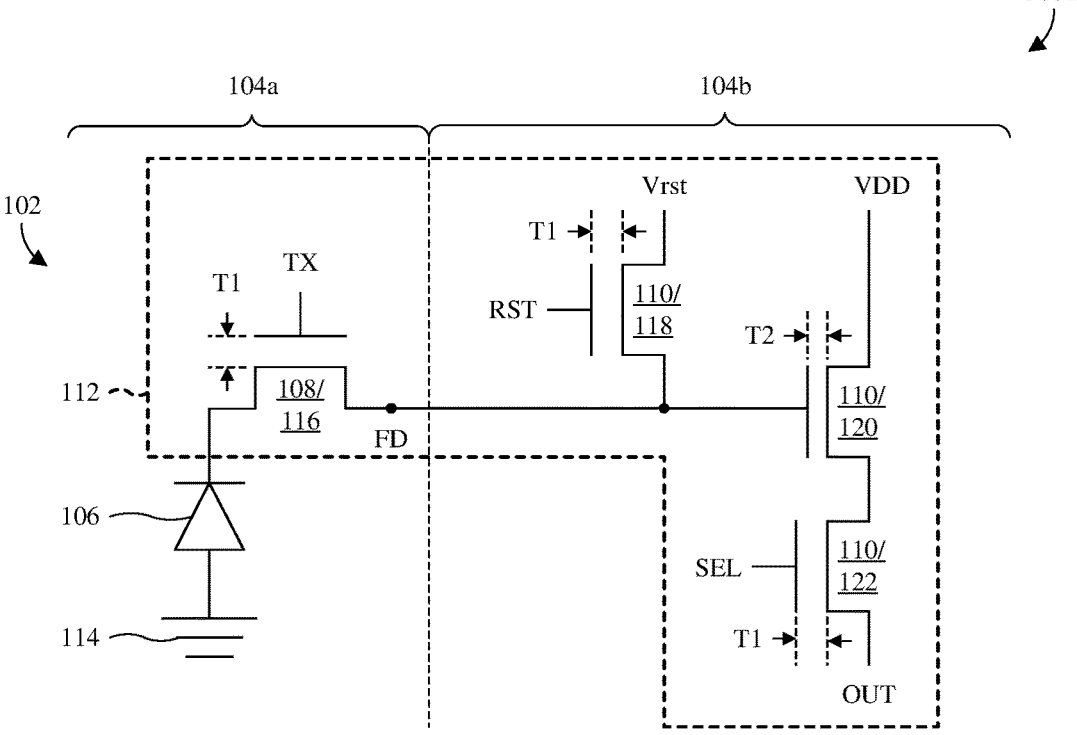

At FIG. 3B, the pixel sensor 102 has only two gate dielectric thicknesses at the second IC chip 104b, which are respectively less than and equal to the first gate dielectric thickness T1 that the pixel sensor 102 has at the first IC chip 104a. These only two gate dielectric thicknesses include the first gate dielectric thickness T1 as described with regard to FIG. 1, and further include the second gate dielectric thickness T2 as described with regard to FIG. 3A. The reset transistor 118 and the select transistor 122 have the first gate dielectric thickness T1, and the source-follower transistor 120 has the second gate dielectric thickness T2.

In alternative embodiments, the reset transistor 118 and the source-follower transistor 120 have the first gate dielectric thickness T1, and the select transistor 122 has the second gate dielectric thickness T2. Further, in alternative embodiments, the source-follower transistor 120 and the select transistor 122 have the first gate dielectric thickness T1, and the reset transistor 118 has the second gate dielectric thickness T2.

Figure 3C:
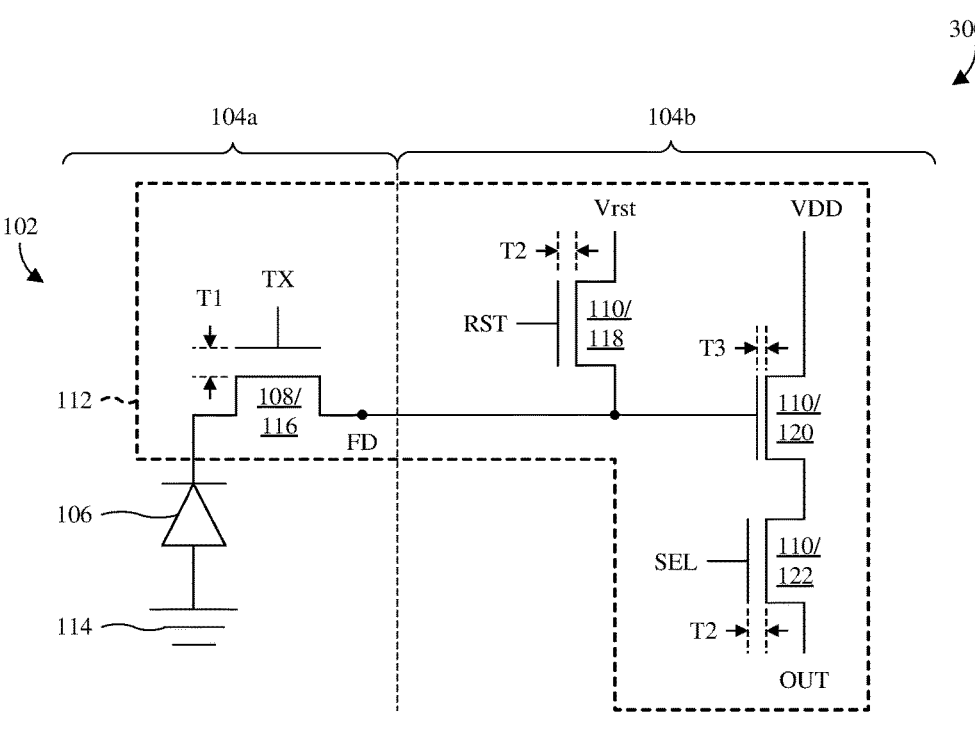

At FIG. 3C, the pixel sensor 102 has only two gate dielectric thicknesses at the second IC chip 104b, each of which is less than the first gate dielectric thickness T1 that the pixel sensor 102 has at the first IC chip 104a. These only two gate dielectric thicknesses include the second gate dielectric thickness T2 as described with regard to FIG. 3A, and further include a third gate dielectric thickness T3 less than the second gate dielectric thickness T2. The reset transistor 118 and the select transistor 122 have the second gate dielectric thickness T2, and the source-follower transistor 120 has the third gate dielectric thickness T3.

In alternative embodiments, the reset transistor 118 and the source-follower transistor 120 have the second gate dielectric thickness T2, and the select transistor 122 has the third gate dielectric thickness T3. Further, in alternative embodiments, the source-follower transistor 120 and the select transistor 122 have the second gate dielectric thickness T2, and the reset transistor 118 has the third gate dielectric thickness T3.

As seen in FIGS. 3A-3C, the source-follower transistor 120 has a lesser gate dielectric thickness than in FIG. 1. Reducing the gate dielectric thickness of the source-follower transistor 120 may lead to better anti-noise performance and/or loop gain for the image sensor. Therefore, the image sensors of FIGS. 3A-3C may have better anti-noise performance and/or better loop gain than the image sensor of FIG. 1. Further, as seen in FIGS. 1 and 3A-3C, the pixel sensor 102 has no more than two gate dielectric thicknesses at the second IC chip 102b. While more than two gate dielectric thicknesses are amenable, more than two gate dielectric thicknesses increase the complexity of forming the pixel sensor 102. Further, the increased complexity may reduce yields and/or limit scaling down of the pixel sensor 102.

Figure 4:
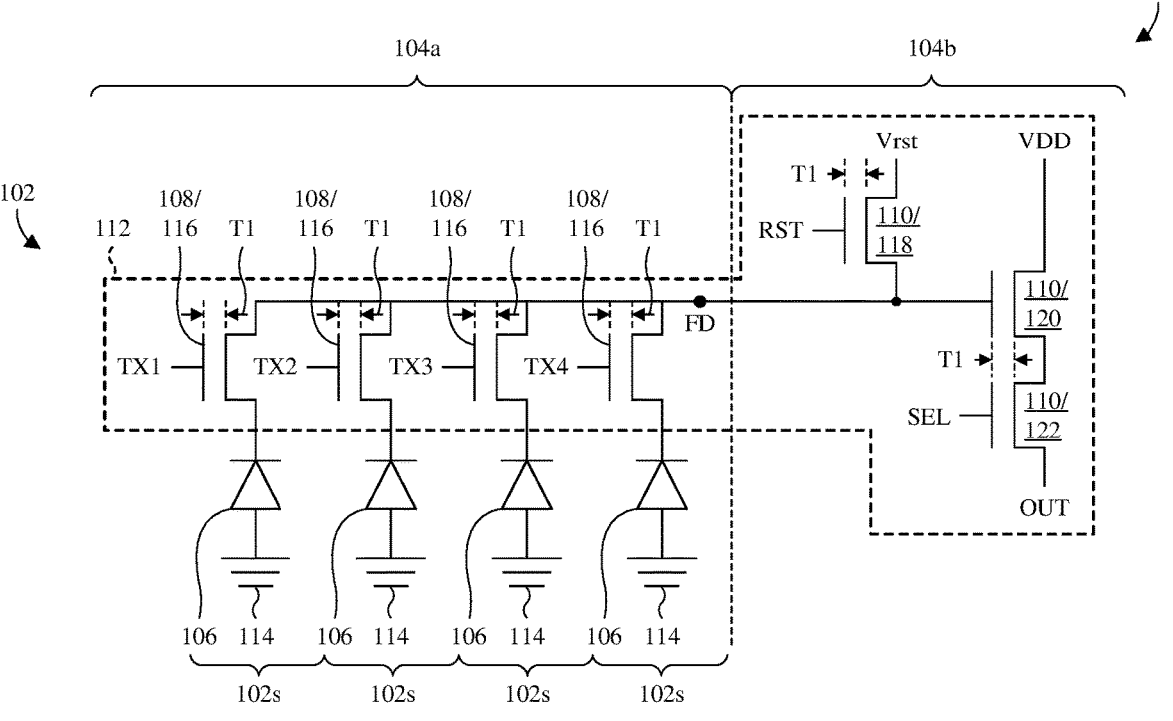
FIG. 4 illustrates a circuit diagram of some alternative embodiments of the image sensor of FIG. 1 in which the pixel sensor comprises a plurality of subpixels.

With reference to FIG. 4, a circuit diagram 400 of some alternative embodiments of the image sensor of FIG. 1 is provided in which the pixel sensor 102 comprises a plurality of subpixels 102s at the first IC chip 104a. More particularly, the pixel sensor 102 comprises a plurality of photodetectors 106 and a plurality of first transistors 108 at the first IC chip 104a. The photodetectors 106 are paired with the first transistors 108 with a one-to-one correspondence, and each photodetector-transistor pair forms a subpixel 102s.

The photodetectors 106 are photodiodes and are electrically coupled from ground 114 respectively to the first transistors 108. For examples, anodes of the photodetectors 106 are electrically coupled to ground 114, and cathodes of the photodetectors 106 are electrically coupled respectively to the first transistors 108. In alternative embodiments, the photodetectors 106 are a type of photodetector other than a photodiode. The first transistors 108 are transfer transistors 116 gated respectively by individual transfer signals TX1, TX2, TX3, and TX4 and are configured to selectively transfer charge that accumulates at the photodetectors 106 to the floating diffusion node FD, which is common to the subpixels 102s. The second transistors 110 are as in FIG. 1 and are shared by the subpixels 102s.

As in FIG. 1, the pixel sensor 102 has only one gate dielectric thickness, a first gate dielectric thickness T1, at the first IC chip 104a. Accordingly, each of the first transistors 108 has the first gate dielectric thickness T1. This simplifies manufacture of the pixel sensor 102 and allows scaling down of the pixel sensor 102 without compromising performance.

Figure 5:
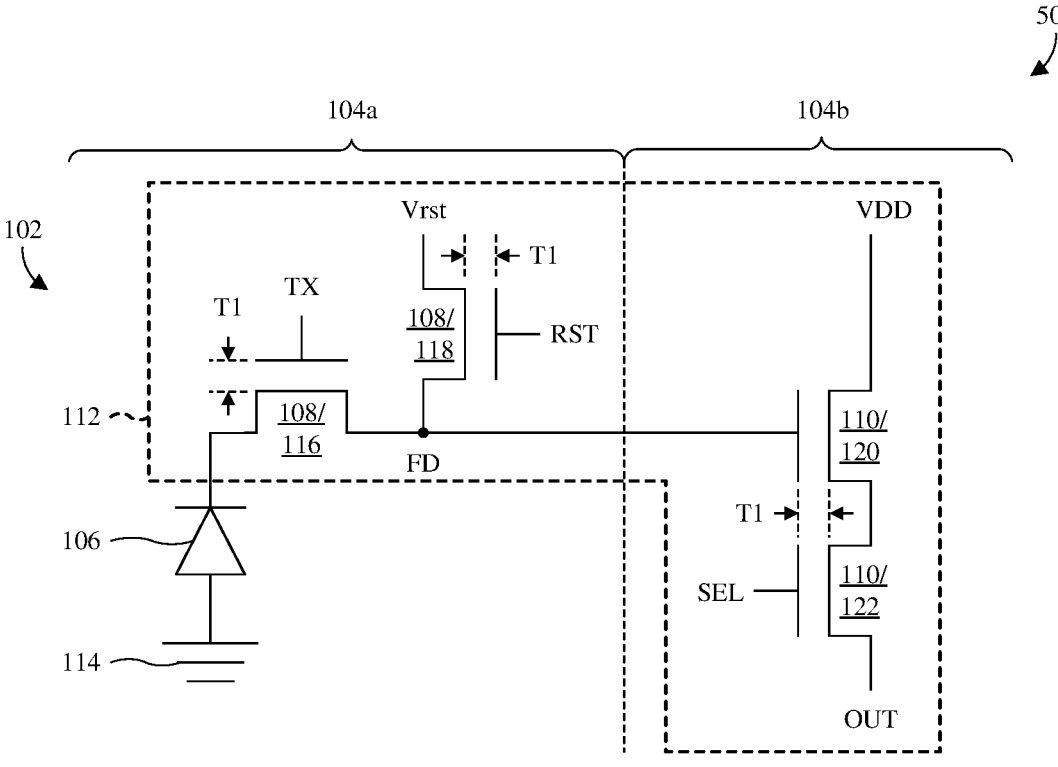
FIG. 5 illustrates a circuit diagram of some alternative embodiments of the image sensor of FIG. 1 in which a reset transistor is at a same IC chip as a photodetector.

With reference to FIG. 5, a circuit diagram 500 of some alternative embodiments of the image sensor of FIG. 1 is provided in which the reset transistor 118 is at the first IC chip 104*a*. Further, the reset transistor 118 has the same gate dielectric thickness, the first gate dielectric thickness T1, as the transfer transistor 116. Accordingly, the pixel sensor 102 still only has one gate dielectric thickness at the first IC chip 104*a*, and the only one gate dielectric thickness is greater than or equal to each gate dielectric thickness at the second IC chip 104*b*.

As seen above (e.g., at FIGS. 1, 3A-3C, 4, and 5), each transistor that the pixel sensor 102 has at the first IC chip 104*a* has a gate dielectric thickness greater than or equal to a maximum gate dielectric thickness amongst all transistors that the pixel sensor 102 has at the second IC chip 104*b*. Further, in some embodiments, each transistor at the first IC chip 104*a* has a gate dielectric thickness greater than or equal to a maximum gate dielectric thickness amongst all transistors at the second IC chip 104*b*.

Figure 6:
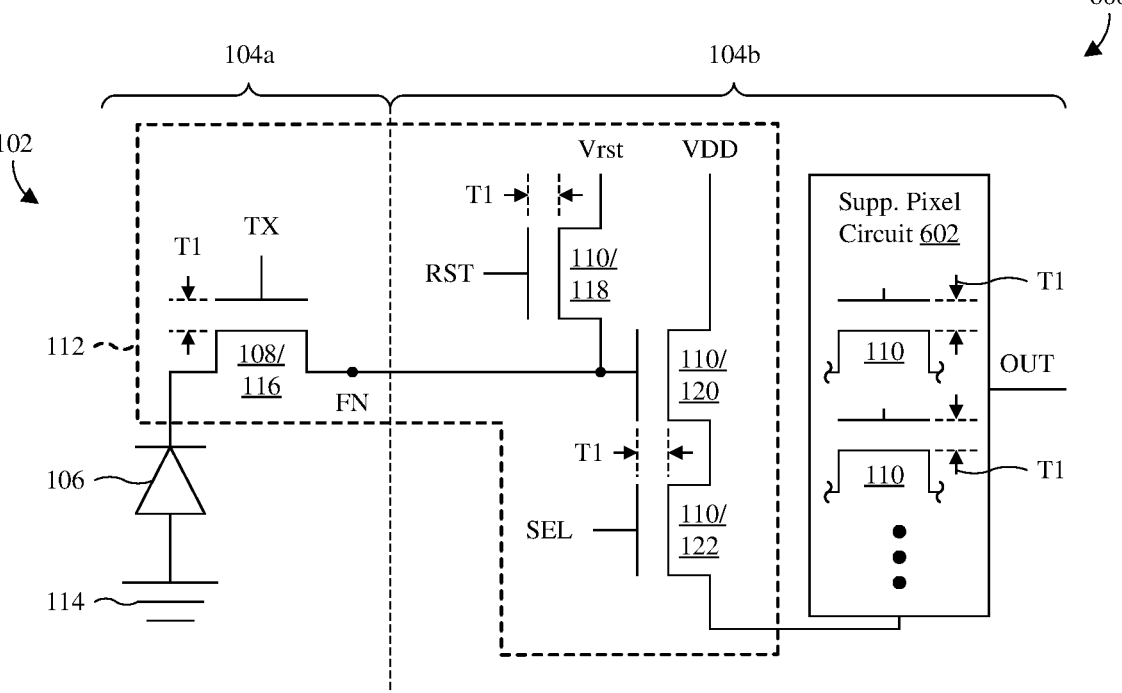
FIG. 6 illustrates a circuit diagram of some alternative embodiments of the image sensor of FIG. 1 in which the pixel sensor comprises a supplemental pixel circuit.

With reference to FIG. 6, a circuit diagram 600 of some alternative embodiments of the image sensor of FIG. 1 is provided in which the pixel sensor 102 has a supplemental pixel circuit 602. The supplemental pixel circuit 602 is electrically coupled between the select transistor 122 and the output OUT of the pixel sensor 102 and is formed by the second transistors 110. Note that the ellipses at the supplemental pixel circuit 602 is used to represent zero or more additional second transistors. Further, the supplemental pixel circuit 602 is configured to perform additional processing on a signal from the select transistor 122 before passing it to the output OUT. For example, noise filtering or the like may be performed.

Because the photodetector 106 is relatively large and is at the first IC chip 104*a*, but not at the second IC chip 104*b*, the portion of the pixel sensor 102 at the first IC chip 104*a* may be what limits scaling down of the pixel sensor 102. Therefore, the portion of the pixel sensor 102 at the second IC chip 104*b* may have free space that enables integration of the supplemental pixel circuit 602 into the pixel sensor 102 without enlarging the pixel sensor 102.

Figure 7:
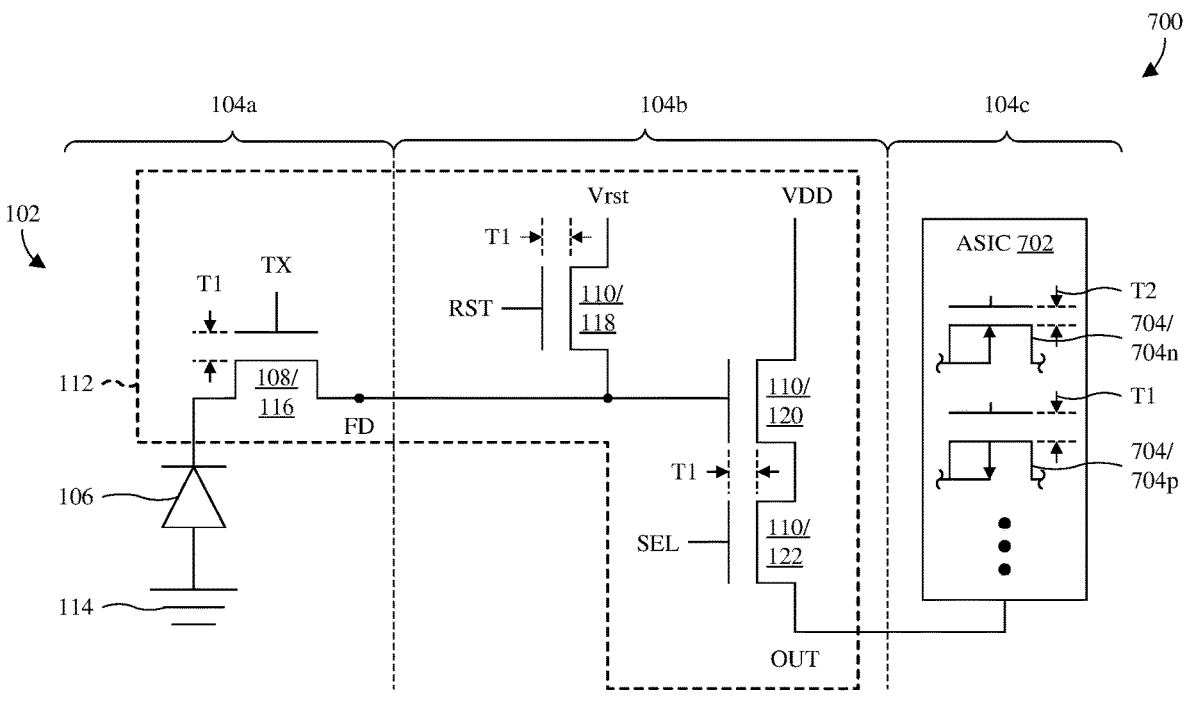
FIG. 7 illustrates a circuit diagram of some alternative embodiments of the image sensor of FIG. 1 in which the image sensor further includes a third IC chip.

With reference to FIG. 7, a circuit diagram 700 of some alternative embodiments of the image sensor of FIG. 1 is provided in which the image sensor further includes a third IC chip 104*c*. The third IC chip 104*c* accommodates an ASIC 702 that is electrically coupled to the pixel sensor 102 and any other pixel sensors (not shown) of the image sensor. The ASIC 702 may, for example, be configured to perform analog-to-digital conversion (ADC), buffering, image processing, the like, or any combination of the foregoing. In some embodiments, the ASIC 702 buffers and performs ADC on the output OUT of the pixel sensor 102 and outputs of any other pixel sensors of the image sensor to generate digital data representing an image, and then performs imaging processing on the image formed by the digital data.

The ASIC 702 has only two gate dielectric thicknesses, the first gate dielectric thickness T1 and the second gate dielectric thickness T2. Further, each of the only two gate dielectric thicknesses that the ASIC 702 has is less than or equal to each gate dielectric thickness that the pixel sensor 102 has at the second IC chip 104*b*. Put another way, each of the only two gate dielectric thicknesses that the ASIC 702 has is less than or equal to a minimum gate dielectric thickness that the pixel sensor 102 has at the second IC chip 104*b*. The first gate dielectric thickness T1 is equal to each gate dielectric thickness that the pixel sensor 102 has at the second IC chip 104*b*, and the second gate dielectric thickness T2 is less than each gate dielectric thickness that the pixel sensor 102 has at the second IC chip 104*b*.

In alternative embodiments, the ASIC 702 has only one gate dielectric thickness, and this only one gate dielectric thickness is less than or equal to each gate dielectric thickness that the pixel sensor 102 has at the second IC chip 104*b*. In yet other alternative embodiments, the ASIC 702 has only three or more gate dielectric thicknesses, and each of these only three or more gate dielectric thickness is less than or equal to each gate dielectric thickness that the pixel sensor 102 has at the second IC chip 104*b*.

The third IC chip 104*c* comprises a plurality of third transistors 704 electrically interconnected to form the ASIC 702, and the third transistors 704 respectively have the only two gate dielectric thicknesses that the ASIC 702 has. Further, the plurality of third transistors 704 comprises at least one n-type transistor 704*n* and at least one p-type transistor 704*p*. Note that the ellipses at the ASIC 702 is used to represent zero or more additional third transistors. The n-type and p-type transistors 704*n*, 704*p* respectively have the first gate dielectric thickness T1 and the second gate dielectric thickness T2. The plurality of third transistors 704 may, for example, be MOSFETs, FinFETs, GAA FETs, nanosheet field-effect transistors, some other suitable type of transistors, or any combination of the foregoing.

In some embodiments, each gate dielectric thickness at the third IC chip 104*c* is less than or equal each gate dielectric thickness at the second IC chip 104*b*, which is less than or equal to each gate dielectric thickness at the first IC chip 104*a*. For example, all transistors at the third IC chip 104*c* have gate dielectric thicknesses less than or equal to a minimum gate dielectric thickness amongst all transistors at the second IC chip 104*b*, and/or all transistors at the second IC chip 104*b* have gate dielectric thicknesses less than or equal to a minimum gate dielectric thickness amongst all transistors at the first IC chip 104*a*.

In some embodiments, the pixel sensor 102 has only one gate dielectric thickness at the first IC chip 104*a*, the pixel sensor 102 has only one or two gate dielectric thicknesses at the second IC chip 104*b*, and the ASIC 702 has only two or more gate dielectric thicknesses at the third IC chip 104*c*. The only one gate dielectric thickness at the first IC chip 104*a* is greater than or equal to a maximum gate dielectric thickness amongst the only one or two gate dielectric thicknesses at the second IC chip 104*b*. Further, a minimum gate dielectric thickness amongst the only one or two gate dielectric thicknesses at the second IC chip 104*b* is greater than or equal to a maximum gate dielectric thickness amongst the only two or more gate dielectric thicknesses at the third IC chip 104*c*.

In some embodiments, the first IC chip 104*a* has only one gate dielectric thickness, the second IC chip 104*b* has only one or two gate dielectric thicknesses, and the third IC chip 104*c* has only two or more gate dielectric thicknesses. The only one gate dielectric thickness of the first IC chip 104*a* is greater than or equal to a maximum gate dielectric thickness amongst the only one or two gate dielectric thicknesses of the second IC chip 104*b*. Further, a minimum gate dielectric thickness amongst the only one or two gate dielectric thicknesses of the second IC chip 104*b* is greater than or equal to a maximum gate dielectric thickness amongst the only two or more gate dielectric thicknesses of the third IC chip 104*c*.

As described above, the ASIC 702 may have only one, two, or more gate dielectric thicknesses, each of which is less than or equal to a minimum gate dielectric thickness that the pixel sensor 102 has at the second IC chip 104c. Further, the pixel sensor 102 may have only one, two, or more gate dielectric thicknesses at the second IC chip 104b, each of which is less than or equal to the only one gate dielectric thickness that the pixel sensor 102 may have at the first IC chip 104a. Accordingly, each gate dielectric thickness that the pixel sensor 102 has at the second IC chip 104b may be said to be inclusively between the only one gate dielectric thickness that the pixel sensor 102 has at the first IC chip 104a and a maximum gate dielectric thickness that the ASIC 702 has at the third IC chip 104c. Further, in some embodiments, the first IC chip 104a may have only one gate dielectric thickness and each gate dielectric thickness at the second IC chip 104b may be said to be inclusively between the only one gate dielectric thickness and a maximum gate dielectric thickness at the third IC chip 104c.

Figure 8:
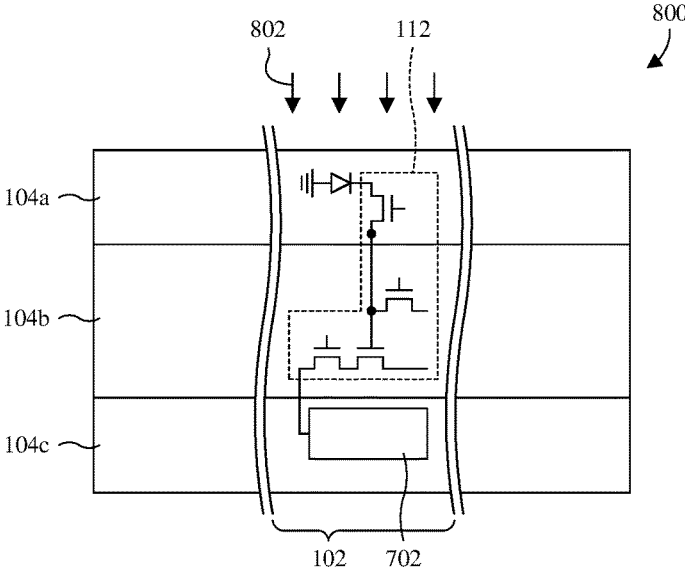
FIG. 8 illustrates a schematic cross-sectional view of some embodiments of the image sensor of FIG. 7.

With reference to FIG. 8, a schematic cross-sectional view 800 of some embodiments of the image sensor of FIG. 7 is provided in which the first, second, and third IC chips 104a-104c are vertically stacked. The first IC chip 104a is at a top of the image sensor, and the second IC chip 104b is between the first and third IC chips 104a, 104c. Further, the image sensor is configured to receive radiation 802 from the top of the image sensor.

With reference to FIGS. 9A-9D, circuit diagrams 900A-900D of some alternative embodiments of the image sensor of FIG. 7 are provided.

Figure 9A:
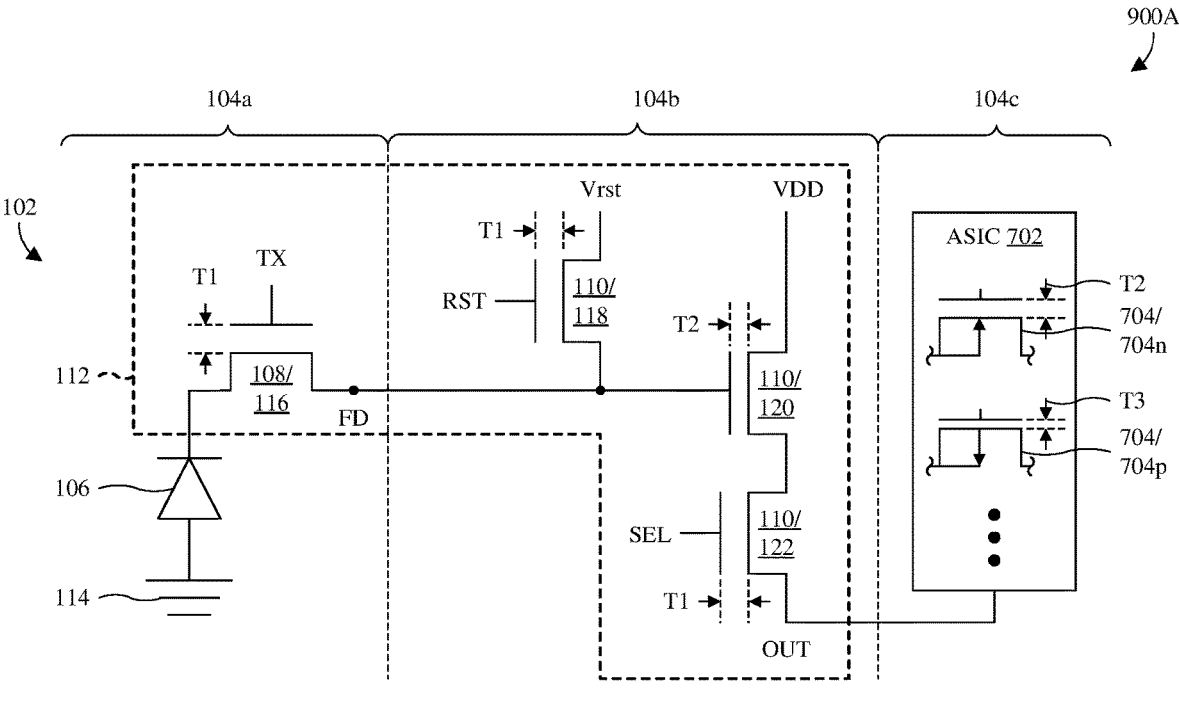
FIGS. 9A-9D illustrate circuit diagrams of some alternative embodiments of the image sensor of FIG. 7.

At FIG. 9A, the pixel sensor 102 has only two gate dielectric thicknesses at the second IC chip 104b, and these only two gate dielectric thicknesses are respectively less than and equal to the only one gate dielectric thickness that the pixel sensor 102 has at the first IC chip 104a. Further, the only two gate dielectric thicknesses at the second IC chip 104b include the first gate dielectric thickness T1 and the second gate dielectric thickness T2. The source-follower transistor 120 has the second gate dielectric thickness T2, whereas the reset transistor 118 and the select transistor 122 have the first gate dielectric thickness T1.

Additionally, the ASIC 702 has only two gate dielectric thicknesses at the third IC chip 104c, and these only two gate dielectric thicknesses are respectively less than and equal to a minimum gate dielectric thickness that the pixel sensor 102 has at the second IC chip 104b. Further, the only two gate dielectric thicknesses at the third IC chip 104c include the second gate dielectric thickness T2 and the third gate dielectric thickness T3 respectively at the n-type and p-type transistors 704n, 704p of the ASIC 702.

Figure 9B:
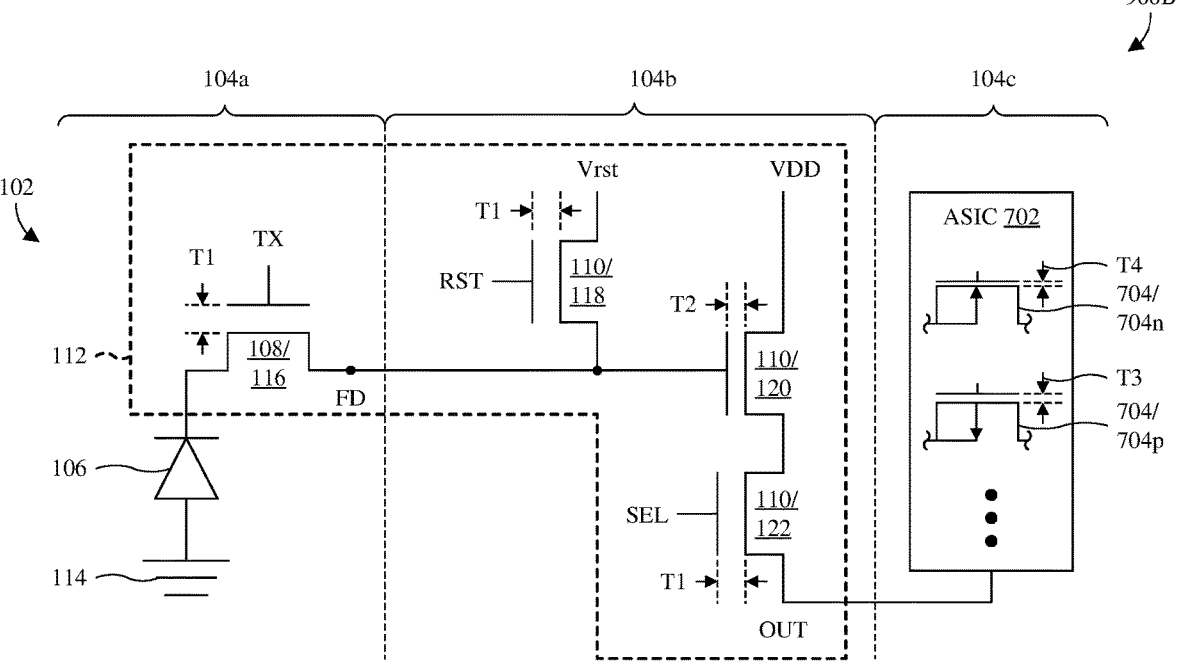

At FIG. 9B, a variant of FIG. 9A is provided in which the only two gate dielectric thicknesses that the ASIC 702 has at the third IC chip 104c are each less than the minimum gate dielectric thickness that the pixel sensor 102 has at the second IC chip 104b. Further, the only two gate dielectric thicknesses at the third IC chip 104c include the third gate dielectric thickness T3 and the fourth gate dielectric thickness T4 respectively at the n-type and p-type transistors 704n, 704p at the ASIC 702.

Figure 9C:
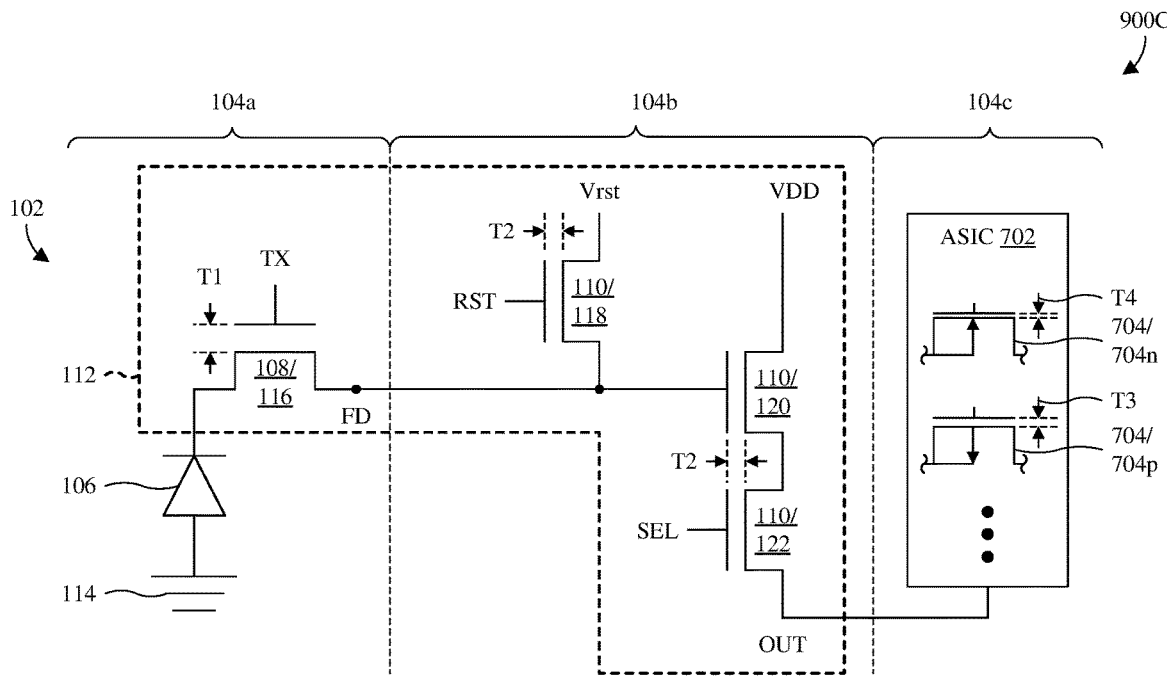

At FIG. 9C, the pixel sensor 102 has only one gate dielectric thicknesses at the second IC chip 104b, and the only one gate dielectric thickness is less than the only one gate dielectric thickness that the pixel sensor 102 has at the first IC chip 104a. Further, the only one gate dielectric thicknesses at the second IC chip 104b includes the second gate dielectric thickness T2, and the source-follower transistor 120, the reset transistor 118, and the select transistor 122 each have the second gate dielectric thickness T2.

Additionally, the ASIC 702 has only two gate dielectric thicknesses at the third IC chip 104c, and these only two gate dielectric thicknesses are each less than the minimum gate dielectric thickness that the pixel sensor 102 has at the second IC chip 104b. Further, the only two gate dielectric thicknesses at the third IC chip 104c include the third gate dielectric thickness T3 and the fourth gate dielectric thickness T4 respectively at the n-type and p-type transistors 704n, 704p at the ASIC 702.

Figure 9D:
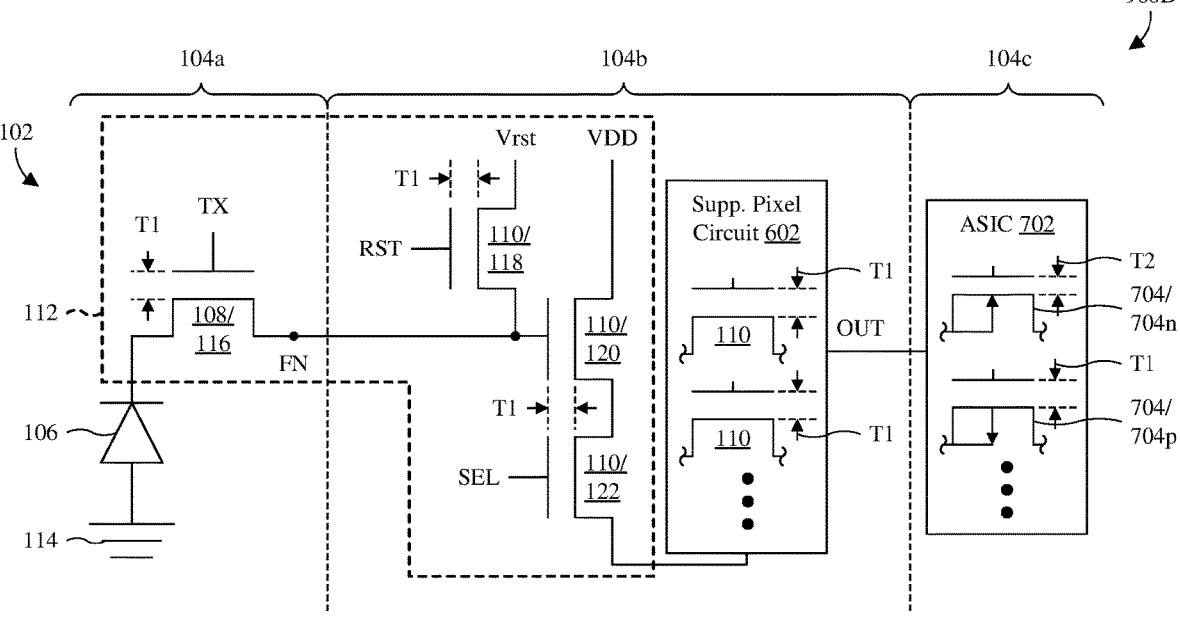

At FIG. 9D, the pixel sensor 102 includes the supplemental pixel circuit 602 described with regard to FIG. 6. The supplemental pixel circuit 602 is electrically coupled between the select transistor 122 and the output OUT of the pixel sensor 102 and is formed by the second transistors 110. Note that the ellipses at the supplemental pixel circuit 602 is used to represent zero or more additional second transistors.

While FIGS. 7 and 9A-9D illustrate certain embodiments of the first and second IC chips 104a, 104b, the first and second IC chips 104a, 104b in FIGS. 7 and 9A-9D may alternatively be as in any of FIGS. 1, 3A-3C, and 4-6. Further, while the ASIC 702 is illustrated as having only two gate dielectric thicknesses at the third IC chip 104c, the ASIC 702 may alternatively have three or more gate dielectric thicknesses.

Figure 10:
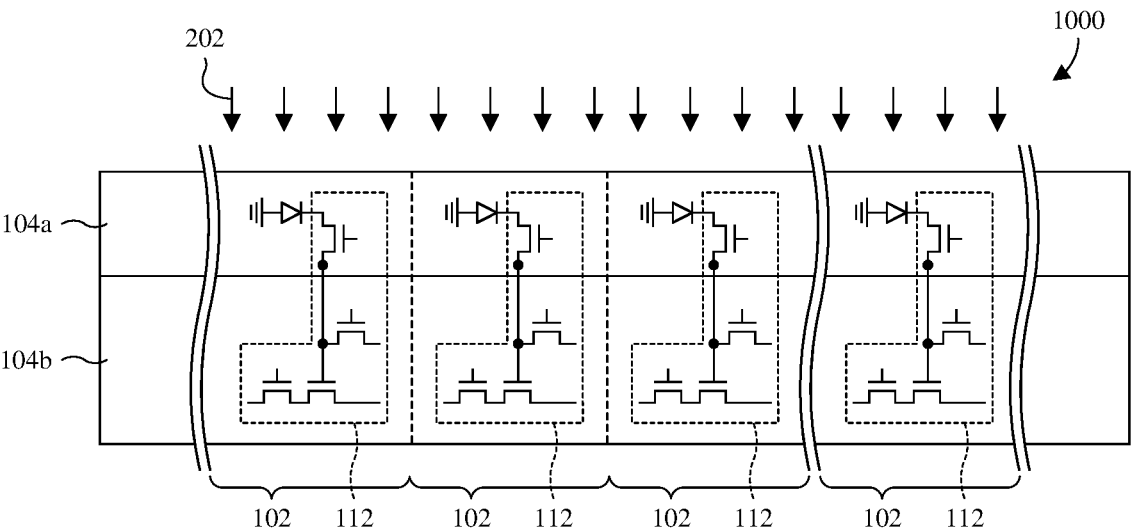
FIG. 10 illustrates a schematic cross-sectional view of some embodiments of an image sensor comprising a plurality of pixel sensors each as in FIG. 1.

With reference to FIG. 10, a schematic cross-sectional view 1000 of some embodiments of an image sensor comprising a plurality of pixel sensors 102 each as in FIG. 1 is provided. Put another way, the pixel sensor 102 of FIG. 1 repeats, such that there are multiple instances or repetitions of the pixel sensor of FIG. 1. In alternative embodiments, the pixel sensors 102 are each as in any of FIGS. 3A-3D and 4-6. Further, the first and second IC chips 104a, 104b are vertically stacked. The first IC chip 104a overlies the second IC chip 104b, and the image sensor is configured to receive radiation 202 from a top of the image sensor.

Figure 11:
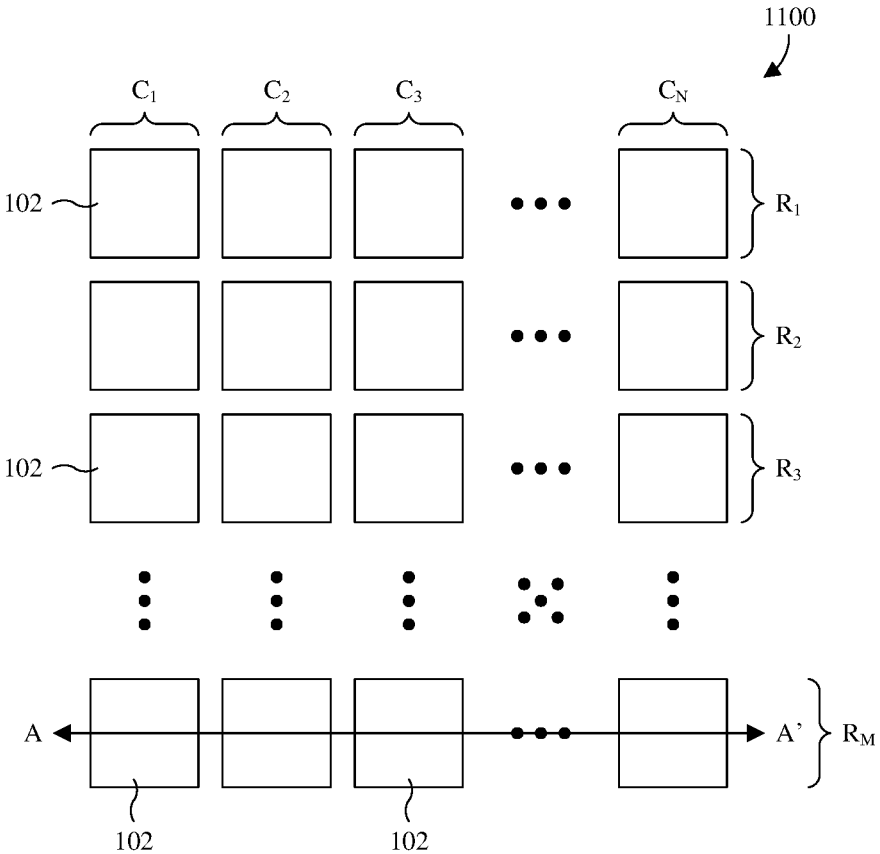
FIG. 11 illustrates a top layout view of some embodiments of the image sensor of FIG. 10.

With reference to FIG. 11, a top layout view 1100 of some embodiments of the image sensor of FIG. 10 is provided in which the plurality of pixel sensors 102 is in a plurality of rows and a plurality of columns. The schematic cross-sectional view 1000 of FIG. 10 may, for example, be taken along line A-A' in FIG. 11.

The plurality of rows includes rows $R_1$, $R_2$, $R_3$, and $R_M$, and the plurality of columns includes columns $C_1$, $C_2$, $C_3$, and $C_N$. Subscripts of the row labels correspond to row numbers, where M is an integer greater than three. Similarly, subscripts of the column labels correspond to column numbers, where N is an integer greater than three. Further, the plurality of rows and columns form a two-dimensional array in which the pixel sensors 102 are in a periodic, grid pattern. Other suitable patterns are amenable in alternative embodiments.

Figure 12:
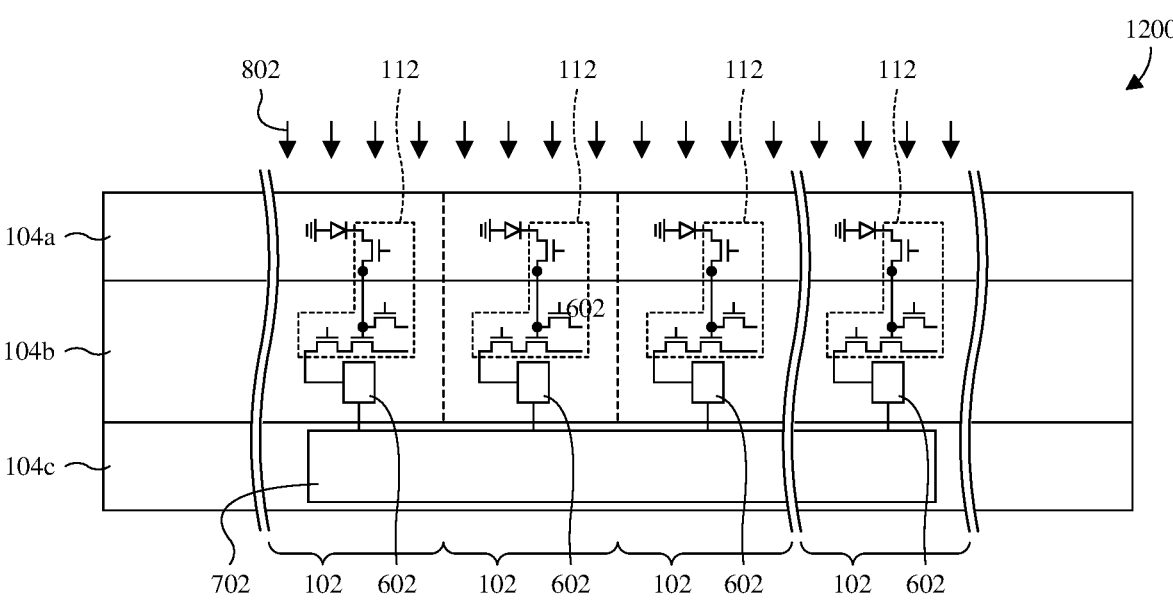
FIG. 12 illustrates a schematic cross-sectional view of some embodiments of an image sensor comprising a plurality of pixel sensors each as in FIG. 9D.

With reference to FIG. 12, a schematic cross-sectional view 1200 of some embodiments of an image sensor comprising a plurality of pixel sensors 102 each as in FIG. 9D is provided. Put another way, the pixel sensor 102 of FIG. 9D repeats, such that there are multiple instances or repetitions of the pixel sensor of FIG. 1. In alternative embodiments, the pixel sensors 102 are each as in any of FIGS. 7 and 9A-9C. Further, the ASIC 702 is shared by the pixel sensors 102. For example, there may be a many-to-one correspondence between the pixel sensors 102 and the ASIC 702. Further yet, the first, second, third IC chips 104a, 104b are vertically stacked. The second IC chip 104b is between the first and third IC chips 104a, 104c, and the image sensor is configured to receive radiation 802 from a top of the image sensor.

While FIG. 11 is described with regard to the image sensor of FIG. 10, it is to be appreciated that FIG. 11 is also applicable to the image sensor of FIG. 12. For example, the schematic cross-sectional view 1200 of FIG. 12 may be taken along line A-A' in FIG. 11.

Figure 13:
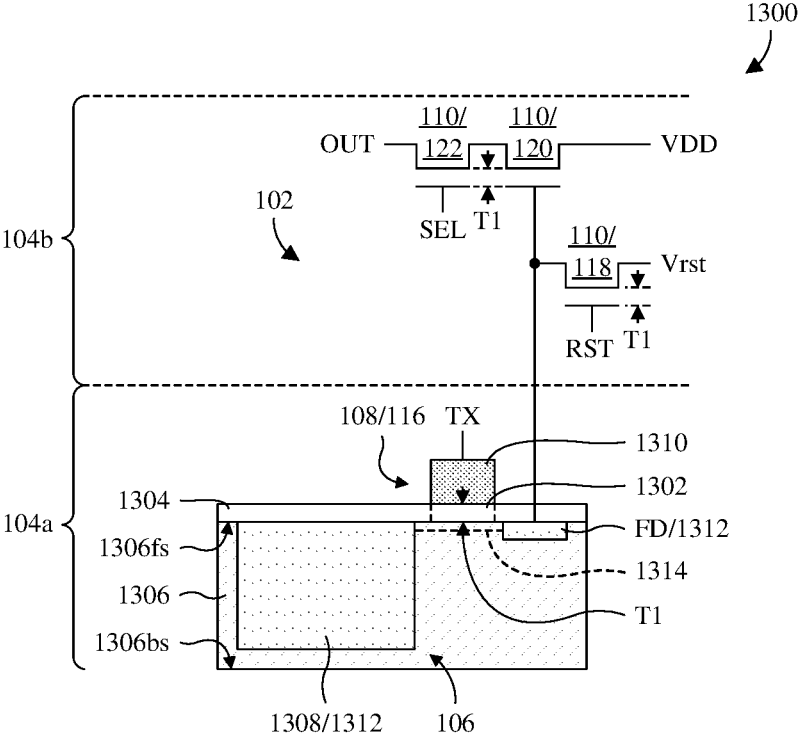
FIG. 13 illustrates a schematic cross-sectional view of some embodiments of the image sensor of FIG. 1 in which a first transistor has a gate dielectric layer formed by a protection layer covering the photodetector.

With reference to FIG. 13, a schematic cross-sectional view 1300 of some embodiments of the image sensor of FIG. 1 is provided in which the first transistor 108 has a first gate dielectric layer 1302 formed by a protection layer 1304 covering and protecting the photodetector 106. The protection layer 1304 covers the photodetector 106 on a frontside 1306fs of a first semiconductor substrate 1306 accommodating the photodetector 106. The protection layer 1304 may, for example, be or comprise silicon oxide, silicon nitride, a high k dielectric material, some other suitable dielectric(s), or any combination of the foregoing. The first semiconductor substrate 1306 may, for example, be a bulk substrate of monocrystalline silicon, silicon germanium, and/or the like, or some other suitable type of semiconductor substrate.

The photodetector 106 is in the first semiconductor substrate 1306 and comprises a collector region 1308. The collector region 1308 corresponds to a doped region of the first semiconductor substrate 1306 and has an opposite doping type as immediately surrounding region of the first semiconductor substrate 1306. For example, the collector region 1308 may have a n doping type, and the immediately surrounding region of the first semiconductor substrate 1306 may have a p doping type, or vice versa. Accordingly, a boundary of the collector region 1308 may, for example, be defined by a PN junction. During operation, the photodetector 106 receives radiation from a backside 1306bs of the first semiconductor substrate 1306, which results in the accumulation of charge in the collector region 1308.

The first transistor 108 is on and partially defined by the frontside 1306fs of the first semiconductor substrate 1306. Further, the first transistor 108 comprises a first gate electrode 1310, the first gate dielectric layer 1302, and a pair of first source/drain regions 1312. The first gate dielectric layer 1302 has the only one gate dielectric thickness that the pixel sensor 102 has at the first IC chip 104a. Accordingly, the first gate dielectric layer 1302 has the first gate dielectric thickness T1. Further, as described above, the first gate dielectric layer 1302 is formed by the protection layer 1304. The first gate dielectric layer 1302 may, for example, be or comprise silicon oxide and/or some other suitable dielectric(s).

The first gate electrode 1310 is stacked with the first gate dielectric layer 1302 and is separated from the first semiconductor substrate 1306 by the first gate dielectric layer 1302. Further, the first gate electrode 1310 has a planar profile. In alternative embodiments, the first gate electrode 1310 has some other suitable profile, an example of which is shown hereafter. The first gate electrode 1310 may, for example, be or comprise doped polysilicon, metal, some other suitable conductive material(s), or any combination of the foregoing.

The first source/drain regions 1312 are in the first semiconductor substrate 1306 and are separated from each other by a first channel region 1314 underlying the first gate electrode 1310. Further, the first source/drain regions 1312 correspond to doped regions of the first semiconductor substrate 1306 sharing a common doping type. One of the first source/drain regions 1312 is formed by the collector region 1308, whereas the other one of the first source/drain regions 1312 is formed by the floating diffusion node FD.

During operation, the first gate electrode 1310 may be biased so the first channel region 1314 conducts. This leads to transfer of the accumulated charge at the collector region 1308 to the floating diffusion node FD. Hence, as described above, the first gate electrode 1310 is more specifically a transfer transistor 116 in the present embodiments.

With reference to FIGS. 14A-14D, schematic cross-sectional views 1400A-1400D of some alternative embodiments of the image sensor of FIG. 13 is provided.

Figure 14A:
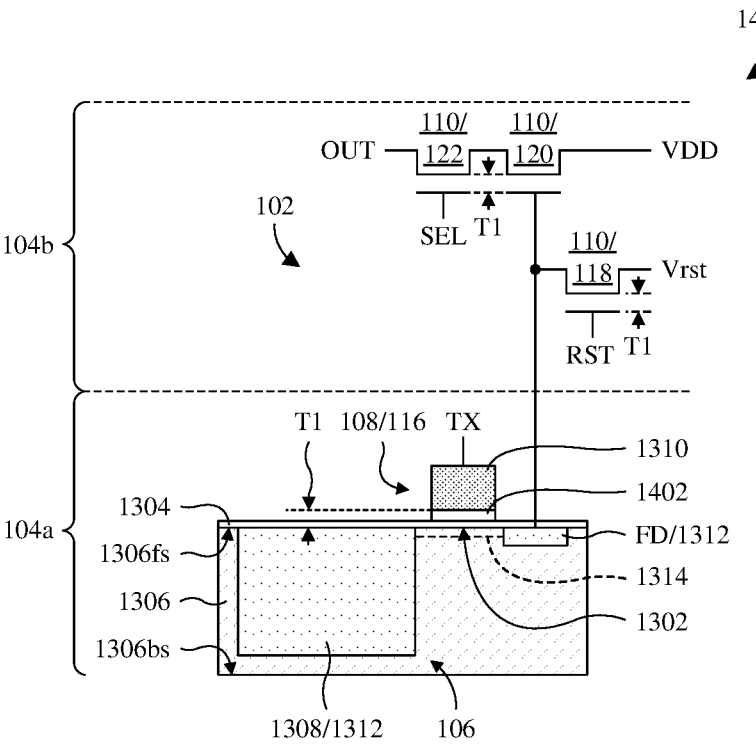
FIGS. 14A-14D illustrate schematic cross-sectional views of some alternative embodiments of the image sensor of FIG. 13.

At FIG. 14A, the first gate dielectric layer 1302 comprises a portion of the protection layer 1304 underlying the first gate electrode 1310 and further comprises a dielectric layer 1402 overlying the portion. Further, the protection layer 1304 has a lesser thickness than the only gate dielectric thickness that the pixel sensor 102 has at the first IC chip 104a. For example, the protection layer 1304 has a lesser thickness than the first gate dielectric thickness T1.

Figure 14B:
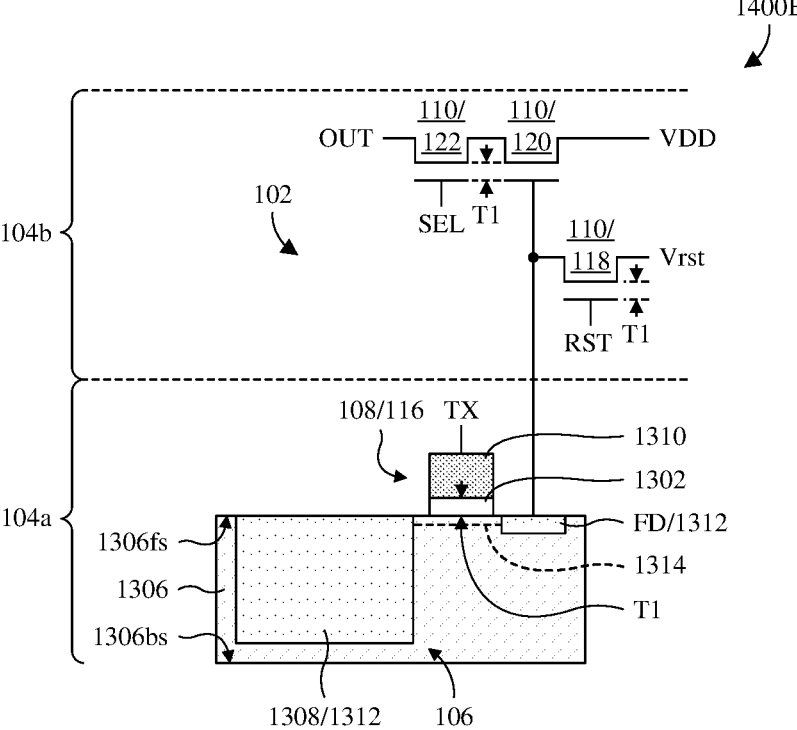

At FIG. 14B, the protection layer 1304 is omitted. Instead, the first gate dielectric layer 1302 is individual to the first transistor 108. In alternative embodiments, the protection layer 1304 persists at covering and hence protecting the photodetector 106 but is instead spaced from the first gate dielectric layer 1302.

Figure 14C:
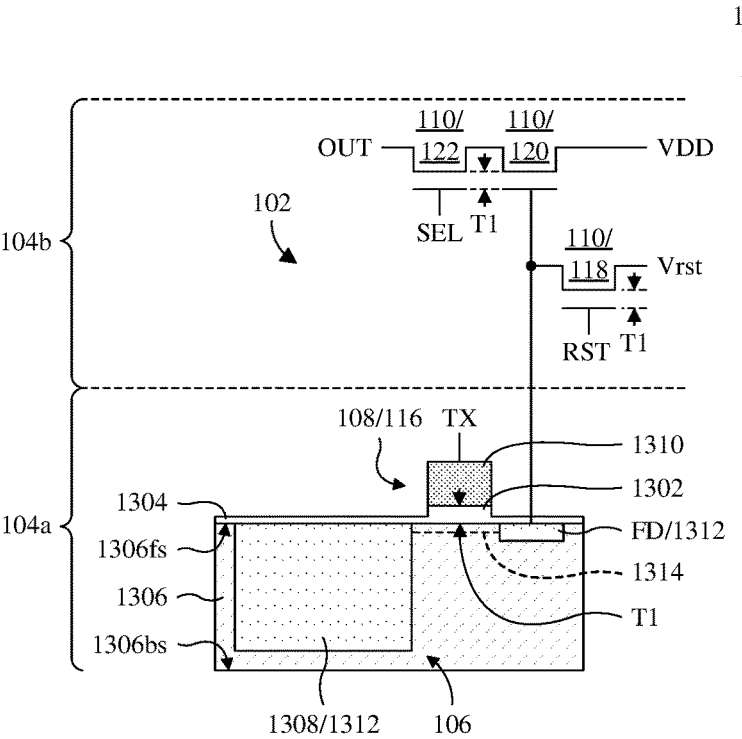

At FIG. 14C, a portion of the protection layer 1304 covered by the first gate electrode 1310 has a greater thickness than a portion of the protection layer 1304 uncovered by the first gate electrode 1310. Because the portion of the protection layer 1304 covered by the first gate electrode 1310 forms the first gate dielectric layer 1302, the greater thickness corresponds to the first gate dielectric thickness T1.

Figure 14D:
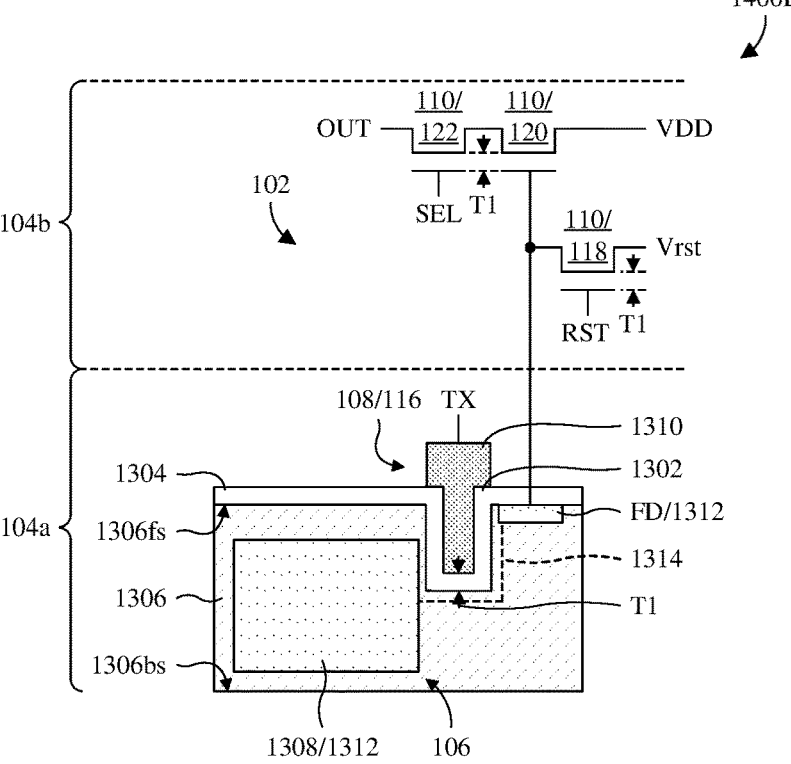

At FIG. 14D, the collector region 1308 is buried in the first semiconductor substrate 1306. Further, the first gate electrode 1310 has a bottom protrusion, whereby the first gate electrode 1310 has a vertically elongated profile. In some embodiments, the first gate electrode 1310 may also be known as a vertical transfer gate. The bottom protrusion protrudes from a bottom of the first gate electrode 1310 into the frontside 1306fs of the first semiconductor substrate 1306 to proximate the collector region 1308. Further, the bottom protrusion is separated from the first semiconductor substrate 1306 by the first gate dielectric layer 1302.

While the portion of the protection layer 1304 covered by the first gate electrode 1310 has the same thickness as the portion of the protection layer 1304 uncovered by the first gate electrode 1310, variations are amenable in alternative embodiments. For example, the portion of the protection layer 1304 uncovered by the first gate electrode 1310 may have a lesser thickness than the portion of the protection layer 1304 covered by the first gate electrode 1310 as illustrated in FIG. 14C. As another example, the portion of the protection layer 1304 uncovered by the first gate electrode 1310 may be omitted as illustrated in FIG. 14B.

While the image sensors of FIGS. 13 and 14A-14D are illustrated using embodiments of the second transistors 110 as in FIG. 1, it is to be appreciated that embodiments of the second transistors as in any of FIGS. 3A-3C, and 4-6 are amenable in alternative embodiments. Further, while the image sensors of FIGS. 13 and 14A-14D are illustrated without the third IC chip 104c at FIGS. 7 and 9A-9D, the image sensors may further include the third IC chip 104c as in any of FIGS. 7 and 9A-9D in alternative embodiments.

Figure 15:
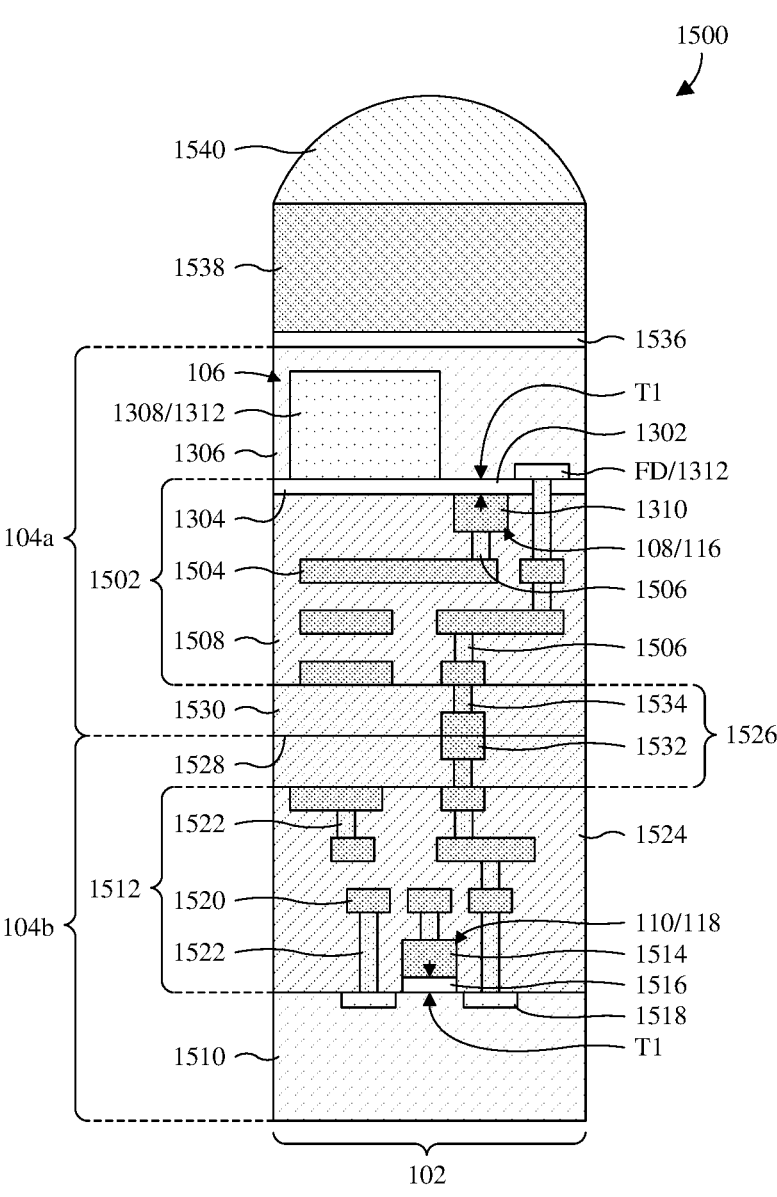
FIG. 15 illustrates a cross-sectional view of some embodiments of the image sensor of FIG. 1.

With reference to FIG. 15, a cross-sectional view 1500 of some embodiments of the image sensor of FIG. 1 is provided. The first IC chip 104a overlies the second IC chip 104b and comprises the first semiconductor substrate 1306, which accommodates the photodetector 106. Additionally, the first IC chip 104a further comprises the first transistor 108 and a first interconnect structure 1502 that underlie the first semiconductor substrate 1306 on the frontside of the first semiconductor substrate 1306. The first transistor 108 and the photodetector 106 may, for example, be as described with regard to FIG. 13. Alternatively, the first transistor 108 and the photodetector 106 may be as in any of FIGS. 14A-14D.

The first interconnect structure 1502 underlies and electrically couples to the first transistor 108 and comprises a plurality of first conductive wires 1504 and a plurality of first conductive vias 1506 in a first interconnect dielectric layer 1508. The first conductive wires 1504 and the first conductive vias 1506 are grouped respectively into a plurality of first wire levels and a plurality of first via levels that are alternatingly stacked to define conductive paths leading from the first transistor 108. Note that a via level closest to the first semiconductor substrate 1306 may also be referred to as a contact via level and hence the first conductive vias 1506 at this via level may also be referred to as contacts or contact vias.

The second IC chip 104b is similar to the first IC chip 104a, and comprises a second semiconductor substrate 1510, the plurality of second transistors 110, and a second interconnect structure 1512. Note that only one of the second transistors 110, the reset transistor 118, is shown. Other second transistors are outside the cross-sectional view 1500. Further, the second transistors 110 and the second interconnect structure 1512 overlie the second semiconductor substrate 1510 on the frontside of the second semiconductor substrate 1510.

The second transistors 110 comprise individual second gate electrodes 1514, individual second gate dielectric layers 1516, and individual pairs of second source/drain regions 1518. The second gate electrodes 1514 are stacked respectively with the second gate dielectric layers 1516, which separate the second gate electrodes 1514 from the second semiconductor substrate 1510. The pairs of second source/drain regions 1518 are in the second semiconductor substrate 1510, and each of the second gate electrodes 1514 is between the second source/drain regions of a respective pair of second source/drain regions 1518.

The second interconnect structure 1512 overlies and electrically couples to the second transistors 110 and comprises a plurality of second conductive wires 1520 and a plurality of second conductive vias 1522 in a second interconnect dielectric layer 1524. The second conductive wires 1520 and the second conductive vias 1522 are grouped respectively into a plurality of second wire levels and a plurality of second via levels that are alternatingly stacked to define conductive paths leading from the second transistors 110.

As described above, the pixel sensor 102 has only one gate dielectric thickness, the first gate dielectric thickness T1, at the first IC chip 104a. Further, the pixel sensor 102 has only one gate dielectric thickness, the first gate dielectric thickness T1, at the second IC chip 104b. In other words, all transistors that the pixel sensor 102 has at the first and second IC chips 104a, 104b have the same gate dielectric thickness. This enables scaling down of the pixel sensor 102 without compromising sensitivity of the photodetector 106.

In alternative embodiments, the only one gate dielectric thickness at the second IC chip 104b is less than the only one gate dielectric thickness at the first IC chip 104a. In alternative embodiments, the pixel sensor 102 has only two or more gate dielectric thicknesses at the second IC chip 104b, and each of these only two or more gate dielectric thicknesses is less than or equal to the only the only one gate dielectric thickness at the first IC chip 104a.

With continued reference to FIG. 15, a first bond structure 1526 is between the first and second IC chips 104a, 104b and facilitates bonding of the first and second IC chips 104a, 104b together at a first bond interface 1528. Such bonding may, for example, include a combination of metal-to-metal bonding and dielectric-to-dielectric bonding at a bond interface.

The first and second IC chips 104a, 104b comprise individual first bond dielectric layers 1530 directly contacting and bonded together at the first bond interface 1528, and further comprise individual first bond pads 1532 directly contacting and bonded together at the first bond interface 1528. The first bond pads 1532 are inset respectively into the first bond dielectric layers 1530 and are electrically coupled respectively to the first and second interconnect structures 1502, 1512 by first bond vias 1534 in the first bond dielectric layers 1530.

A backside passivation layer 1536, a color filter 1538, and a micro lens 1540 are stacked over the first IC chip 104a on a backside of the first semiconductor substrate 1306. The backside passivation layer 1536 is dielectric and transparent to radiation. The color filter 1538 is between the backside passivation layer 1536 and the micro lens 1540. Further, the color filter 1538 is configured to transmit first color wavelengths (e.g., red color wavelengths or the like) while blocking second color wavelengths. The micro lens 1540 is configured to focus incident radiation on the photodetector 106 to enhance quantum efficiency.

Figure 16A:
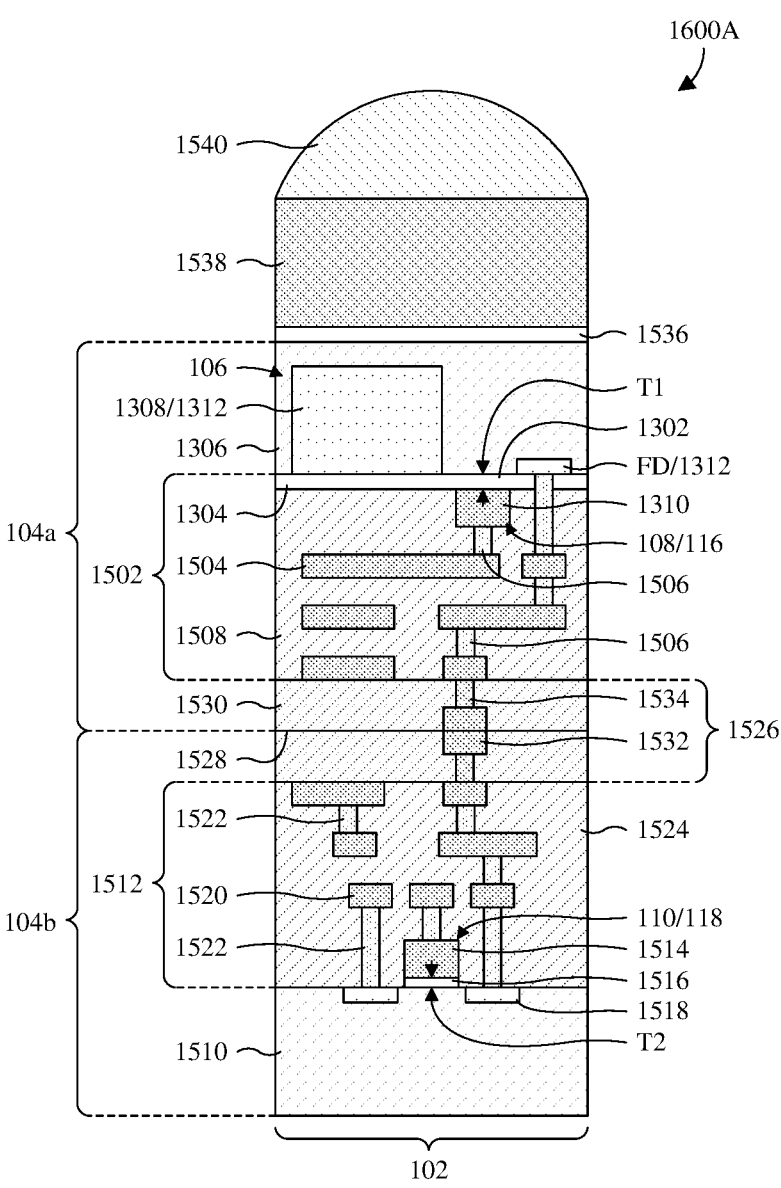
FIGS. 16A-16C illustrate cross-sectional views of some alternative embodiments of the image sensor of FIG. 15.
Figure 16B:
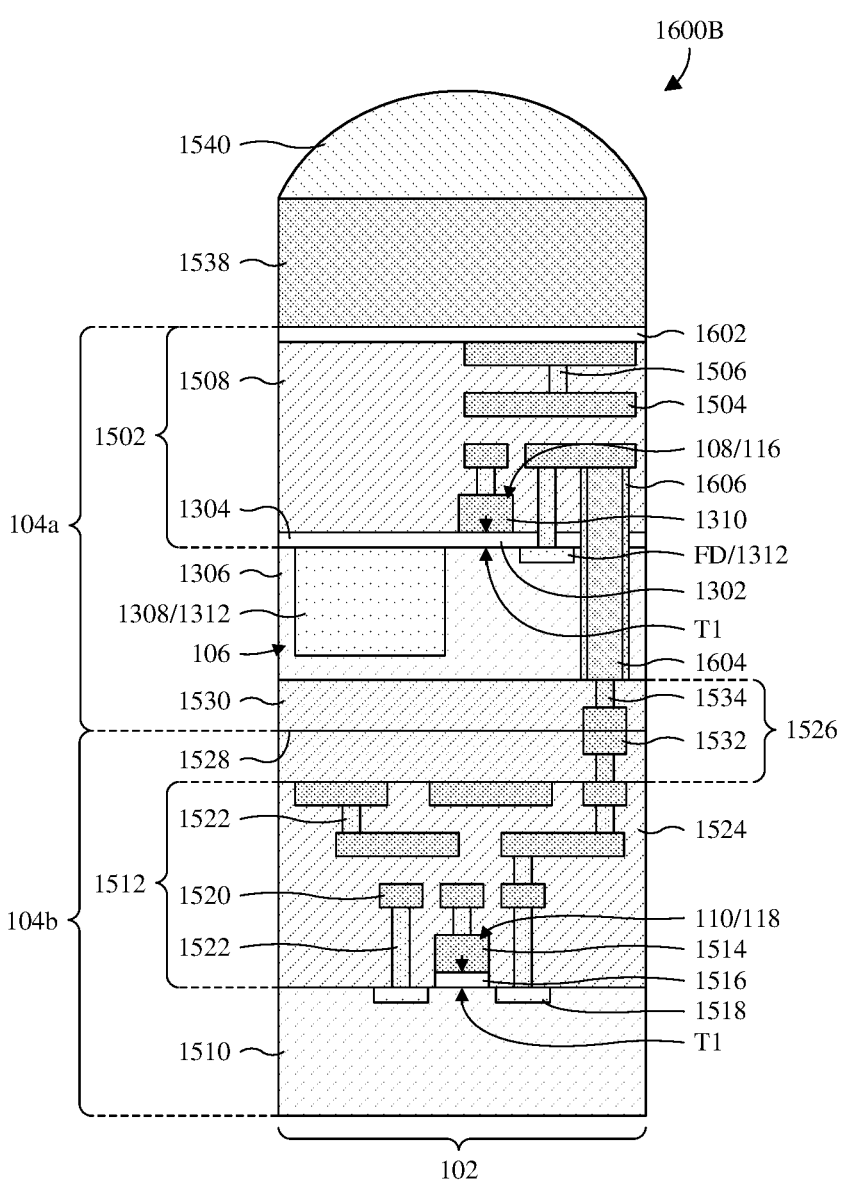
Figure 16C:
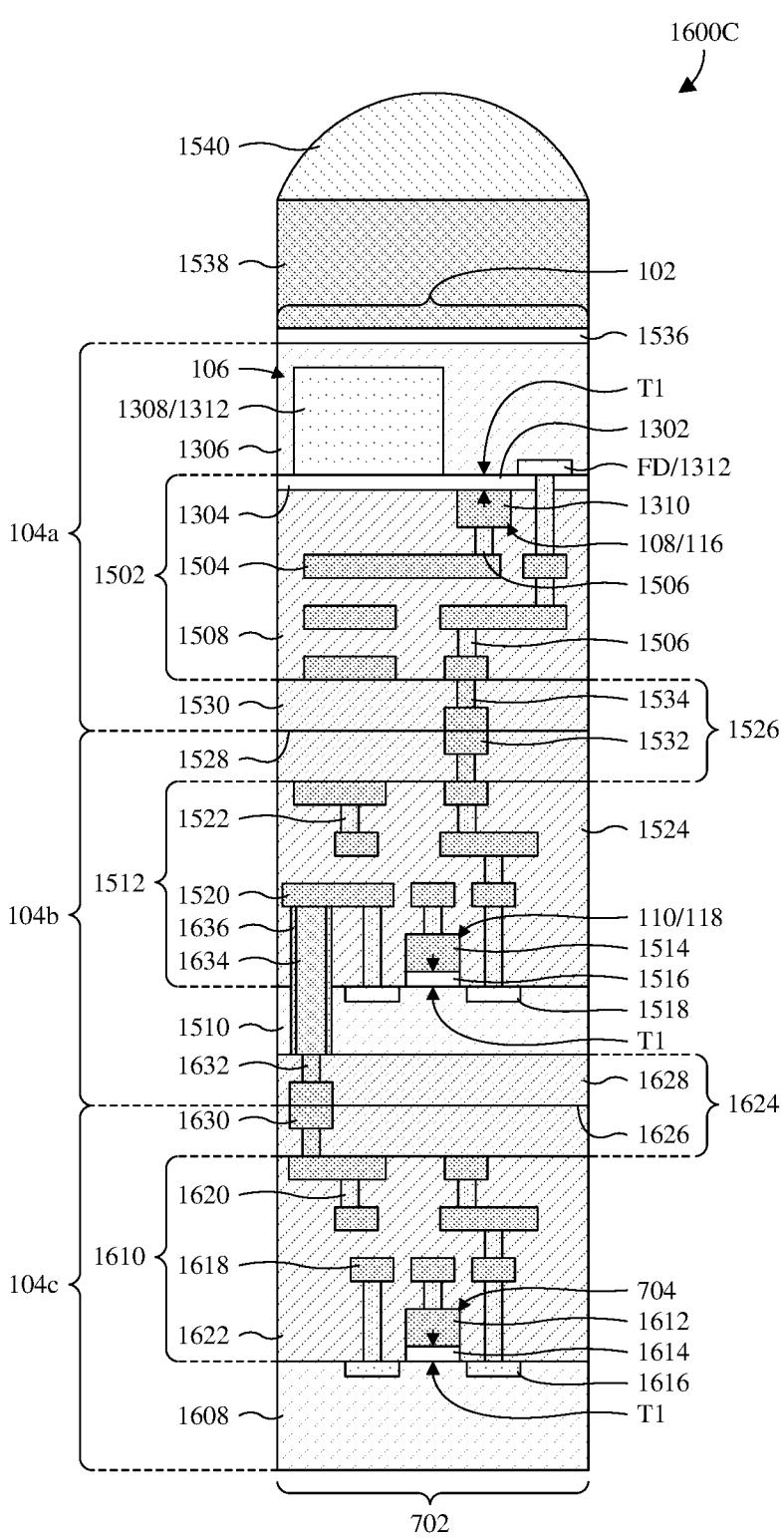

With reference to FIGS. 16A-16C, cross-sectional views 1600A-1600C of some alternative embodiments of the image sensor of FIG. 15 are provided.

At FIG. 16A, the individual second gate dielectric layer 1516 of the reset transistor 118 has the second gate dielectric thickness T2, which is less than the only one gate dielectric thickness (e.g., the first gate dielectric thickness T1) that the pixel sensor has at the first IC chip 104a. Further, in some embodiments, the image sensor corresponds to the circuit diagram 300A of FIG. 3A or the circuit diagram 300C of FIG. 3C.

At FIG. 16B, the image sensor is frontside illuminated instead of backside illuminated. Further, in some embodiments, the image sensor corresponds to the circuit diagram 300A of FIG. 3A or the circuit diagram 300C of FIG. 3C.

The first semiconductor substrate 1306 and the first interconnect structure 1502 are vertically flipped, and the first interconnect structure 1502 is arranged over the first semiconductor substrate 1306. Additionally, the backside passivation layer 1536 is omitted, a frontside passivation layer 1602 separates the color filter 1538 from the first interconnect structure 1502, and a through substrate via (TSV) 1604 extends through the first semiconductor substrate 1306. The TSV 1604 extends from the first interconnect structure 1502 to the first bond structure 1526 to provide electrical coupling between the first interconnect structure 1502 and the bond structure 1526. Further, the TSV 1604 is separated from the first semiconductor substrate 1306 by a TSV dielectric layer 1606.

At FIG. 16C, the image sensor further comprises the third IC chip 104c underlying and bonded to the second IC chip 104b. Further, in some embodiments, the image sensor corresponds to circuit diagram 700 of FIG. 7.

The third IC chip 104c is similar to the second IC chip 104b, and comprises a third semiconductor substrate 1608, the plurality of third transistors 704, and a third interconnect structure 1610. Note that only one of the third transistors 704 is shown. Other third transistors are outside the cross-sectional view 1600C of FIG. 16C. Further, the third transistors 704 and the third interconnect structure 1610 overlie the third semiconductor substrate 1608 on the frontside of the third semiconductor substrate 1608.

The third transistors 704 form an ASIC 702 and comprise individual third gate electrodes 1612, individual third gate dielectric layers 1614, and individual pairs of third source/drain regions 1616. The third gate electrodes 1612 are stacked respectively with the third gate dielectric layers 1614, which separate the third gate electrodes 1612 from the third semiconductor substrate 1608. The pairs of third source/drain regions 1616 are in the third semiconductor substrate 1608, and each of the third gate electrodes 1612 is between the third source/drain regions of a respective pair of third source/drain regions 1616.

The third interconnect structure 1610 overlies and electrically couples to the third transistors 704, and further comprises a plurality of third conductive wires 1618 and a plurality of third conductive vias 1620 in a third interconnect dielectric layer 1622. The third conductive wires 1618 and the third conductive vias 1620 are grouped respectively into a plurality of third wire levels and a plurality of third via levels that are alternatingly stacked to define conductive paths leading from the third transistors 704.

As described above, the ASIC 702 has only two or more gate dielectric thicknesses at the third IC chip 104c. The only two or more gate dielectric thicknesses include the first gate dielectric thickness T1 and at least one other gate dielectric thickness outside the cross-sectional view 1600C of FIG. 16C. Further, each of the only two or more gate dielectric thicknesses is less than or equal to a minimum gate dielectric thickness that the pixel sensor 102 has at the first and second IC chips 104a, 104b.

A second bond structure 1624 is between the second and third IC chips 104b, 104c and facilitates bonding of the second and third IC chips 104b, 104c together at a second bond interface 1626. Such bonding may, for example, include a combination of metal-to-metal bonding and dielectric-to-dielectric bonding at a bond interface. The second and third IC chips 104b, 104c comprise individual second bond dielectric layers 1628 directly contacting and bonded together at the second bond interface 1626. Further, the second and third IC chips 104b, 104c comprise individual second bond pads 1630 directly contacting and bonded together at the second bond interface 1626. The second bond pads 1630 are inset respectively into the second bond dielectric layers 1628 and are electrically coupled respectively to the second and third interconnect structures 1512, 1610 by second bond vias 1632 in the second bond dielectric layers 1628.

The second bond via 1632 at the third IC chip 104c extends to the third interconnect structure 1610, whereas the second bond via 1632 at the second IC chip 104b extends to a TSV 1634. The TSV 1634 extends through the second semiconductor substrate 1510 from the second interconnect structure 1512 and is separated from the second semiconductor substrate 1510 by a TSV dielectric layer 1636.

Figure 17:
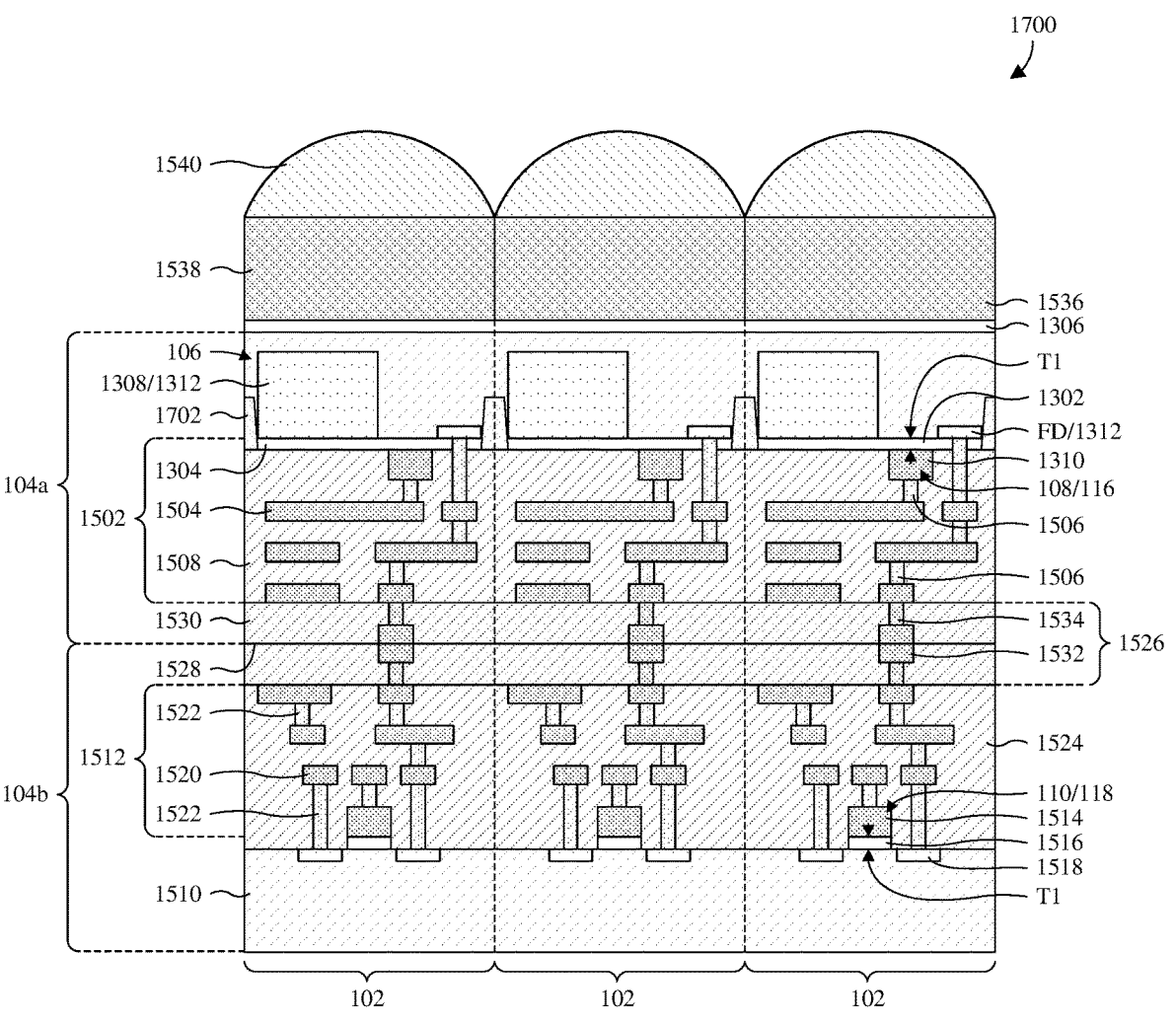
FIG. 17 illustrates a cross-sectional view of some embodiments of an image comprising a plurality of pixel sensors each as in FIG. 15.

With reference to FIG. 17, a cross-sectional view 1700 of some embodiments of an image sensor comprising a plurality of pixel sensors 102 each as in FIG. 15 is provided. Further, at the first IC chip 104a, a trench isolation structure 1702 extends into the frontside of the first semiconductor substrate 1306 to separate the pixel sensors 102 from each other. The trench isolation structure 1702 comprises a dielectric material and may, for example, be a shallow trench isolation (STI) structure and/or a deep trench isolation (DTI) structure.

While the image sensor of FIG. 17 is illustrated and described using embodiments of the pixel sensors 102 at FIG. 15, the image sensor may use embodiments of the pixel sensors 102 at any of FIGS. 16A-16C in alternative embodiments. Further, while the image sensor of FIG. 17 is illustrated and described without the third IC chip 104c of FIG. 16C, the image sensor may include the third IC chip 104c in alternative embodiments.

With reference to FIGS. 18, 19A, 19B, 20, 21, 22A, 22B, 23A, 23B, 24-26, 27A, 27B, 28A, 28B, and 29, a series of views of some embodiments of a method for forming a stacked CMOS image sensor is provided in which a pixel sensor spans multiple IC chips. The stacked CMOS image sensor may, for example, correspond to the stacked CMOS image sensor of FIG. 16C or some other suitable image sensor.

As illustrated by the views of FIGS. 18, 19A, 19B, and 20, a first IC chip 104a comprising a first portion 102a of a pixel sensor is formed. The first portion 102a of the pixel sensor has only one gate dielectric thickness, a first gate dielectric thickness T1, at the first IC chip 104a. Further, the first portion 102a of the pixel sensor has a total number of transistors that is less than a total number of transistors that the pixel sensor has. For example, the first portion 102a of the pixel sensor may have only one transistor.

Figure 18:
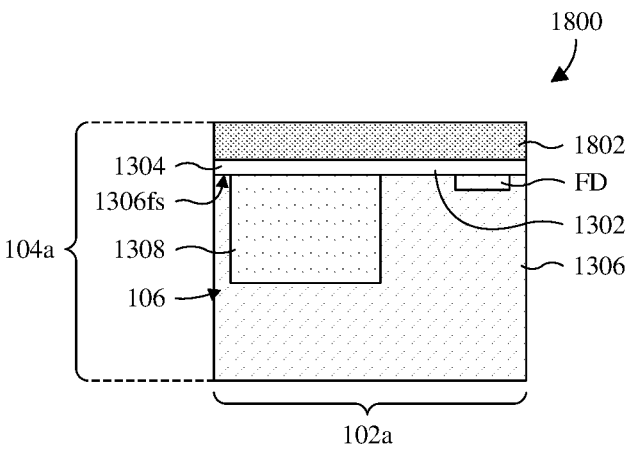
FIGS. 18, 19A, 19B, 20, 21, 22A, 22B, 23A, 23B, 24-26, 27A, 27B, 28A, 28B, and 29 illustrate a series of views of some embodiments of a method for forming a stacked CMOS image sensor in which a pixel sensor spans multiple IC chips.

As illustrated by a cross-sectional view 1800 of FIG. 18, a photodetector 106 and a floating diffusion node FD are formed in a first semiconductor substrate 1306. The photodetector 106 and the floating diffusion node FD are laterally separated from each other, and the photodetector 106 comprises a collector region 1308. The collector region 1308 and the floating diffusion node FD correspond to doped regions of the first semiconductor substrate 1306 and share a common doping type that is opposite to a doping type of immediately surrounding portions of the first semiconductor substrate 1306. As such, boundaries of the collector region 1308 and the floating diffusion node FD may be demarcated by PN junctions.

Also illustrated by the cross-sectional view 1800 of FIG. 18, a protection layer 1304 and a first gate electrode layer 1802 are deposited covering the frontside 1306fs of the first semiconductor substrate 1306. The protection layer 1304 is dielectric and separates the first gate electrode layer 1802 from the first semiconductor substrate 1306. The protection layer 1304 may, for example, be or comprise silicon oxide, some other suitable oxide(s), a high k dielectric, some other suitable dielectric(s), or any combination of the foregoing. The first gate electrode layer 1802 is conductive and may, for example, be or comprise doped polysilicon, metal, some other suitable conductive material(s), or any combination of the foregoing.

Figure 19A:
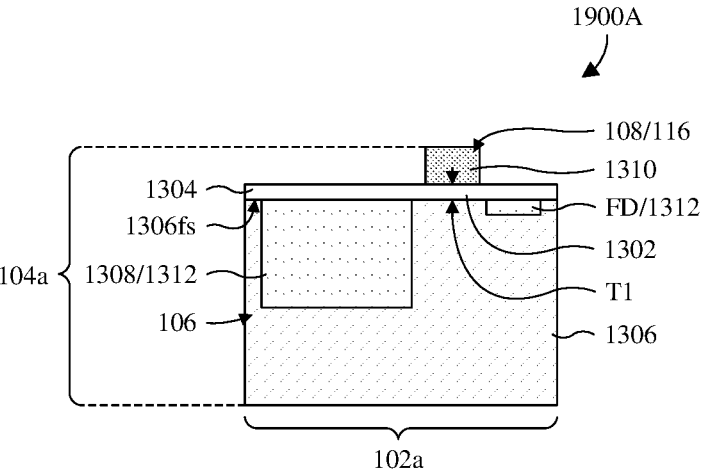
Figure 19B:
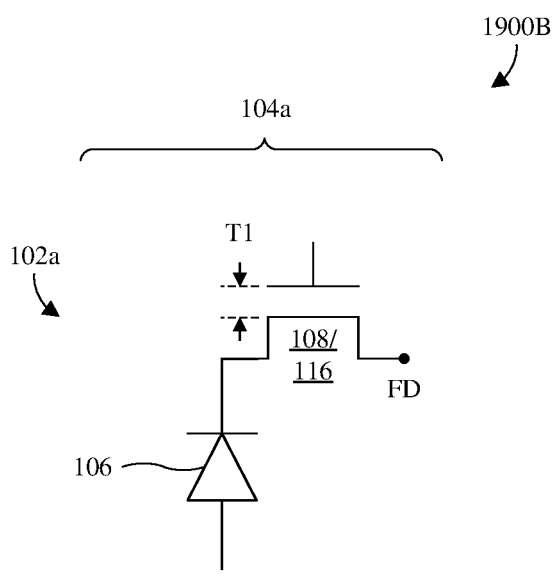

As illustrated by a cross-sectional view 1900A of FIG. 19A, and a circuit diagram 1900B of FIG. 19B, the first gate electrode layer 1802 is patterned to form a first gate electrode 1310. The first gate electrode 1310 is laterally between the collector region 1308 and the floating diffusion node FD. Further, the first gate electrode 1310 is separated from the first semiconductor substrate 1306 by a portion of the protection layer 1304, which may also be referred to as a first gate dielectric layer 1302 and which has the first gate dielectric thickness T1.

The first gate electrode 1310 and the first gate dielectric layer 1302, together with the collector region 1308 and the floating diffusion node FD, form a first transistor 108. The collector region 1308 and the floating diffusion node FD serve as a pair of first source/drain regions 1312 for the first transistor 108. As such, during use of the first transistor 108, a conductive channel forms from the collector region 1308 to the floating diffusion node FD depending upon whether a gate-source voltage of the first transistor 108 is above or below a threshold voltage. The conductive channel may, for example, be used to transfer charge that accumulates in the collector region 1308 to the floating diffusion node FD. Hence, the first transistor 108 may also be referred to as a transfer transistor 116.

The patterning of the first gate electrode layer 1802 may, for example, be performed by a photolithography/etching process or some other suitable patterning process. The photolithography/etching process may, for example, comprise forming a mask over the first gate electrode layer 1802 and performing an etch into first gate electrode layer 1802 with the mask in place. The etch is illustrated as stopping before etching into the protection layer 1304. However, the etch may alternatively etch partially or fully through the protection layer 1304.

Figure 20:
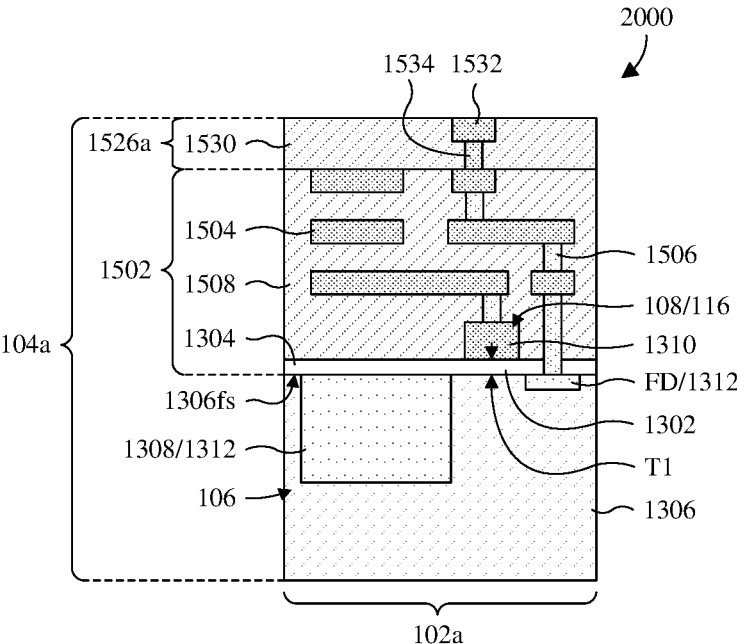

As illustrated by a cross-sectional view 2000 of FIG. 20, a first interconnect structure 1502 is formed over and electrically coupled to the first transistor 108 and the floating diffusion node FD. The first interconnect structure 1502 comprises a plurality of first conductive wires 1504 and a plurality of first conductive vias 1506 in a first interconnect dielectric layer 1508. The first conductive wires 1504 and the first conductive vias 1506 are grouped respectively into a plurality of first wire levels and a plurality of first via levels that are alternatingly stacked to define conductive paths.

Also illustrated by the cross-sectional view 2000 of FIG. 20, a first bond substructure 1526a is formed on the first interconnect structure 1502. The first bond substructure 1526a comprises a first bond pad 1532 and a first bond via 1534 in a first bond dielectric layer 1530. The first bond pad 1532 and the first bond dielectric layer 1530 form a common bond surface, and the first bond via 1534 extends from the first bond pad 1532 to the first interconnect structure 1502.

Figure 21:
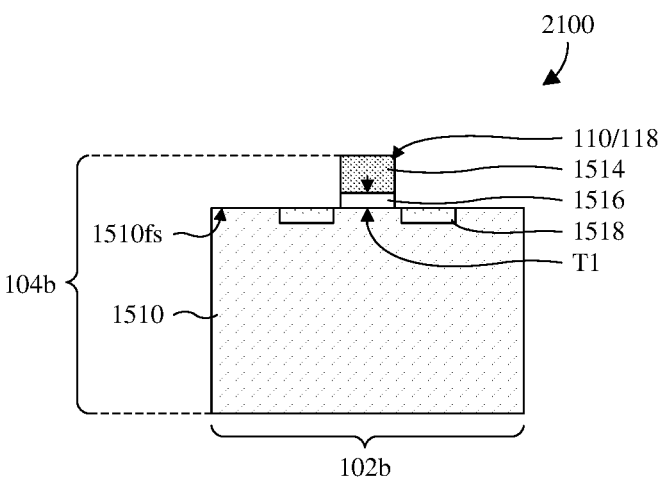
Figure 22A:
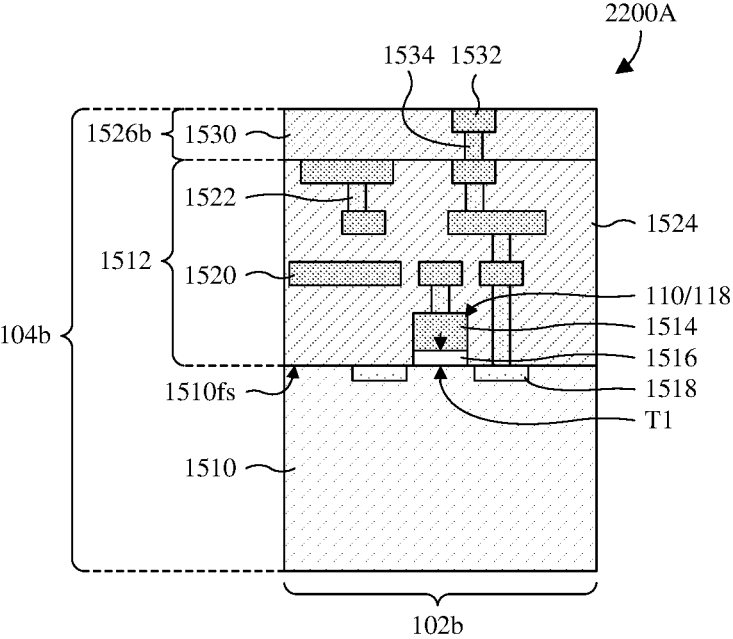
Figure 22B:
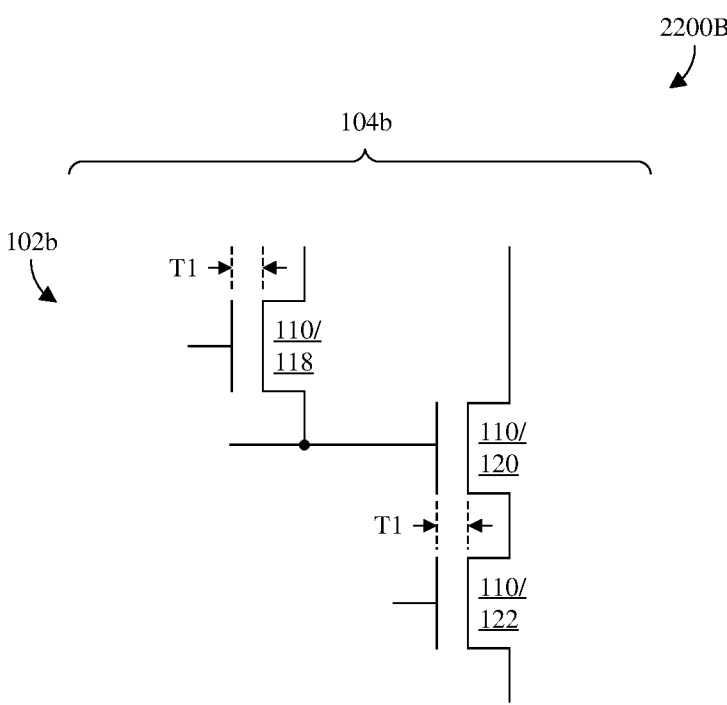

As illustrated by the views of FIGS. 21, 22A, and 22B, a second IC chip 104b comprising a second portion 102b of the pixel sensor is formed. The second portion 102b of the pixel sensor has only one, two, or more gate dielectric thicknesses, each of which is less than or equal to the only one gate dielectric thickness that the first portion 102a of the pixel sensor has. For example, the second portion 102b of the pixel sensor may have only one or two gate dielectric thicknesses, including the first gate dielectric thickness T1, at the second IC chip 104b. Further, the second portion 102b of the pixel sensor has a total number of transistors that is less than a total number of transistors that the pixel sensor 102 has and that is, in some embodiments, more than a total number of transistors that the first portion 102a of the pixel sensor has. For example, the first portion 102a of the pixel sensor may have only one transistor, whereas the second portion 102b of the pixel sensor may have only three or more transistors.

As illustrated by a cross-sectional view 2100 of FIG. 21, a plurality of second transistors 110 is formed on a frontside 1510fs of a second semiconductor substrate 1510. Note that only one of the second transistors 110, a reset transistor 118, is shown. However, additional second transistors (e.g., a select transistor and a source-follower transistors) are shown hereafter in FIG. 22B. The second transistors 110 comprise individual second gate electrodes 1514, individual second gate dielectric layers 1516, and individual pairs of second source/drain regions 1518. The second gate electrodes 1514 are stacked respectively with the second gate dielectric layers 1516, which separate the second gate electrodes 1514 from the second semiconductor substrate 1510. Further, the second gate dielectric layers 1516 each have a thickness less than or equal to the only gate dielectric thickness that the first portion 102a of the pixel sensor has. For example, the second gate dielectric layer 1516 of the reset transistor 118 may have the first gate dielectric thickness T1. The pairs of second source/drain regions 1518 are in the second semiconductor substrate 1510, and each of the second gate electrodes 1514 is between the second source/drain regions of a respective pair of second source/drain regions 1518.

As illustrated by a cross-sectional view 2200A of FIG. 22A, and a circuit diagram 2200B of FIG. 22B, a second interconnect structure 1512 and a second bond substructure 1526b are formed stacked over and electrically coupled to the second transistors 110. The second interconnect structure 1512 comprises a plurality of second conductive wires 1520 and a plurality of second conductive vias 1522 in a second interconnect dielectric layer 1524. The second conductive wires 1520 and the second conductive vias 1522 are grouped respectively into a plurality of second wire levels and a plurality of second via levels that are alternatingly stacked to define conductive paths. The second bond substructure 1526b overlies and electrically couples to the second interconnect structure 1512. Further, the second bond substructure 1526b is as the first bond substructure 1526a is described, except that the first bond via 1534 extends from the first bond pad 1532 to the second interconnect structure 1512.

Focusing on the circuit diagram 2200B of FIG. 22B, the plurality of second transistors 110 comprises the reset transistor 118, a source-follower transistor 120, and a select transistor 122 electrically interconnected by the second interconnect structure 1512 (see, e.g., FIG. 22A). The source-follower transistor 120 and the select transistors 122 are electrically coupled in series. Further, the reset transistor 118 has a source/drain region electrically coupled (e.g., electrically shorted) to a gate electrode of the source-follower transistor 120.

Figure 23A:
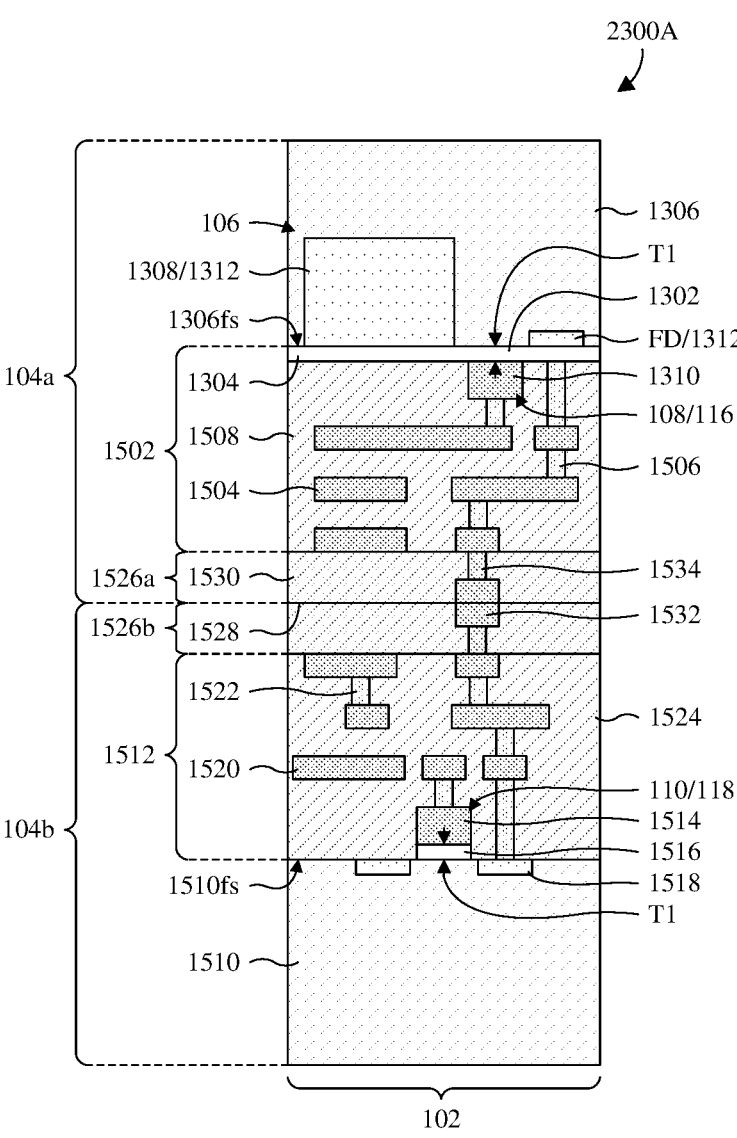
Figure 23B:
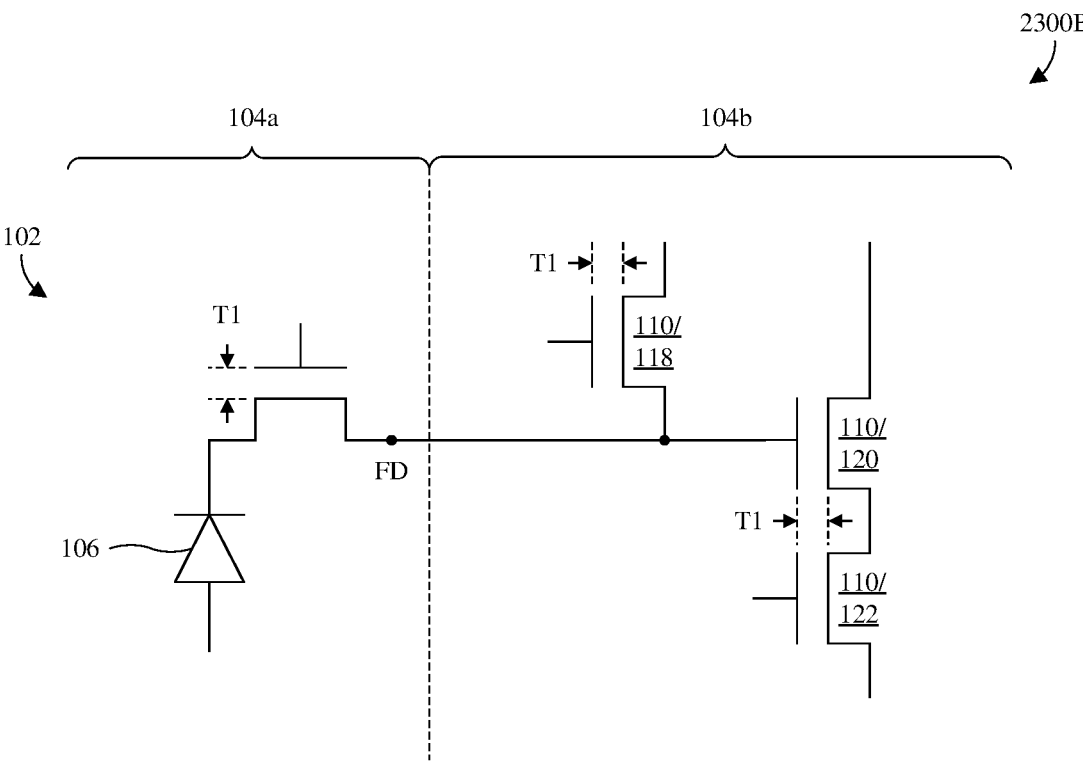

As illustrated by a cross-sectional view 2300A of FIG. 23A, and a circuit diagram 2300B of FIG. 23B, the first IC chip 104a of FIG. 20 is vertically flipped and is bonded to the second IC chip 104b of FIGS. 22A and 22B at a first bond interface 1528. The bonding forms the pixel sensor 102 from the first portion 102a of the pixel sensor 102 at FIG. 20 and from the second portion 102b of the pixel sensor 102 at FIGS. 22A and 22B.

Because the pixel sensor 102 is spread across the first and second IC chips 104a, 104b, the pixel sensor 102 has fewer transistors at the first IC chip 104a than it would otherwise have. For example, instead of having four transistors at the first IC chip 104a, the pixel sensor 102 may only have one transistor at the first IC chip 104a. This, in turn, allows the pixel sensor 102 to be scaled down at the first IC chip 104a without scaling down the photodetector 106. Further, because the pixel sensor 102 has only one gate dielectric thickness (e.g., the first gate dielectric thickness T1) at the first IC chip 104a, the complexity of forming the first transistor 108 is reduced compared to what it would otherwise be. As such, the first transistor 108 may be more readily scaled down. This, in turn, further allows the pixel sensor 102 to be scaled down at the first IC chip 104a without scaling down the photodetector 106.

Because the photodetector 106 is relatively large and is at the first IC chip 104a, but not at the second IC chip 104b, the portion of the pixel sensor 102 at the first IC chip 104a may be what limits scaling down of the pixel sensor 102. Hence, scaling down the pixel sensor 102 at the first IC chip 104a may have the effect of scaling down an entirety of the pixel sensor 102. Because the pixel sensor 102 may be scaled down without scaling down the photodetector 106, as described above, performance of the pixel sensor 102 may be high even at small sizes.

Figure 24:
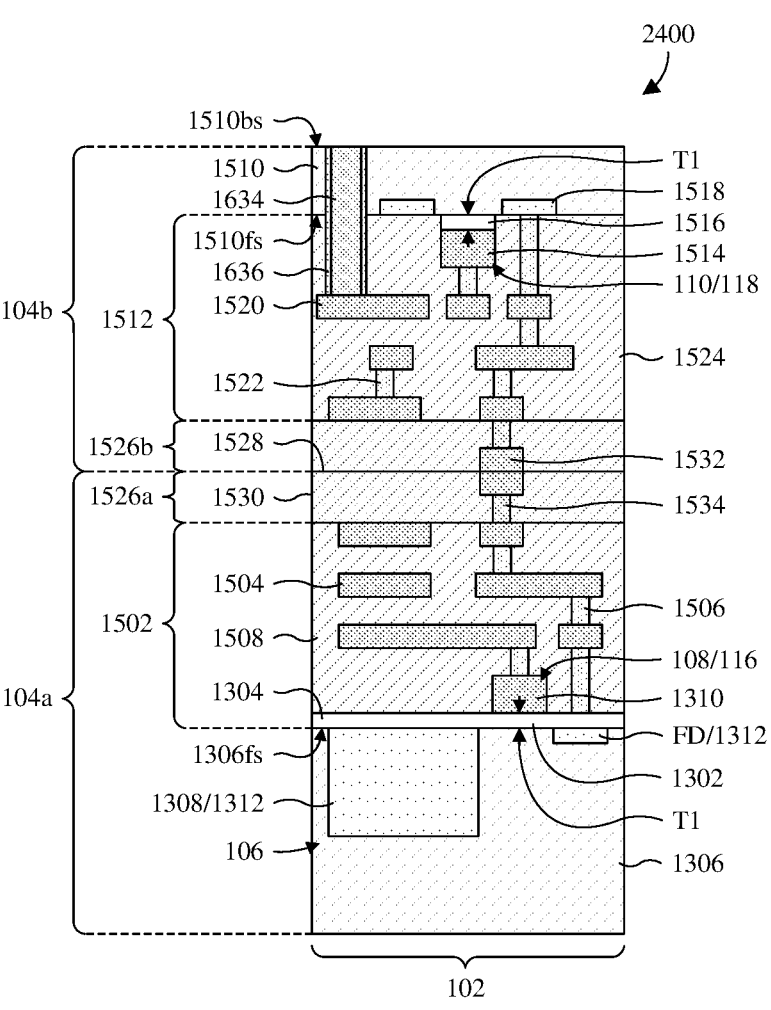

As illustrated by a cross-sectional view 2400 of FIG. 24, the structure of FIGS. 23A and 23B is vertically flipped and the second semiconductor substrate 1510 is thinned from a backside 1510bs of the second semiconductor substrate 1510. The thinning may, for example, be performed by a chemical mechanical polish (CMP) or the like.

Also illustrated by the cross-sectional view 2400 of FIG. 24, a TSV 1634 is formed extending through the second semiconductor substrate 1510 from the backside 1510bs of the second semiconductor substrate 1510 to the second interconnect structure 1512. Further, the TSV 1634 is formed separated from the second semiconductor substrate 1510 and the second interconnect dielectric layer 1524 by a TSV dielectric layer 1636.

Figure 25:
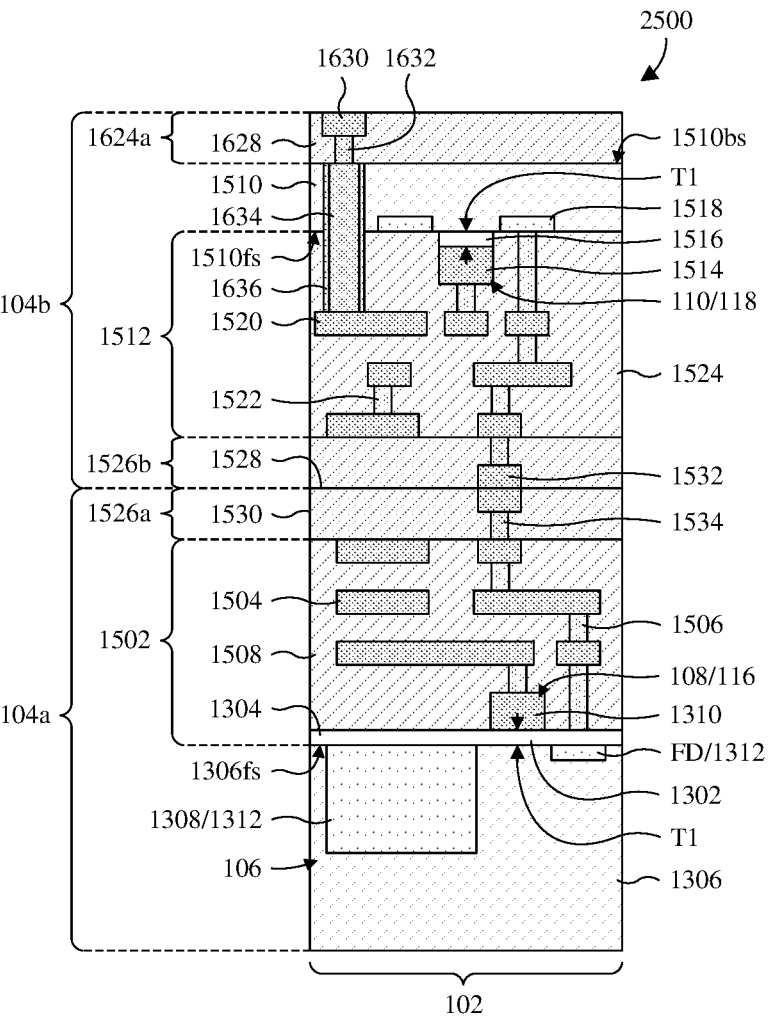

As illustrated by a cross-sectional view 2500 of FIG. 25, a third bond substructure 1624a is formed on the backside 1510bs of the second semiconductor substrate 1510. The third bond substructure 1624a comprises a second bond pad 1630 and a second bond via 1632 in a second bond dielectric layer 1628. The second bond pad 1630 and the second bond dielectric layer 1628 form a common bond surface, and the second bond via 1632 extends from the second bond pad 1630 to the TSV 1634.

Figure 26:
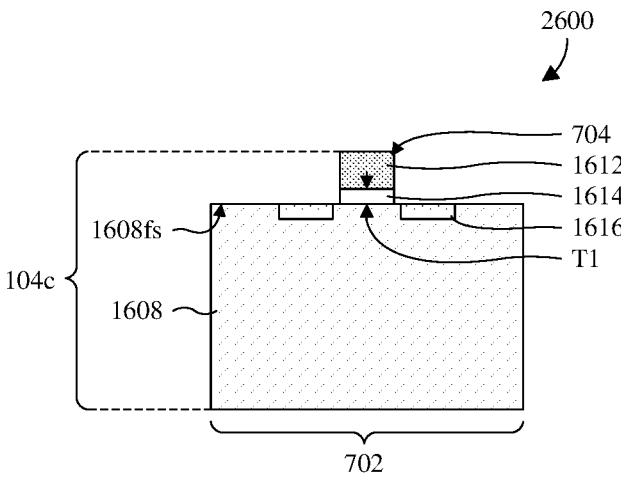
Figure 27A:
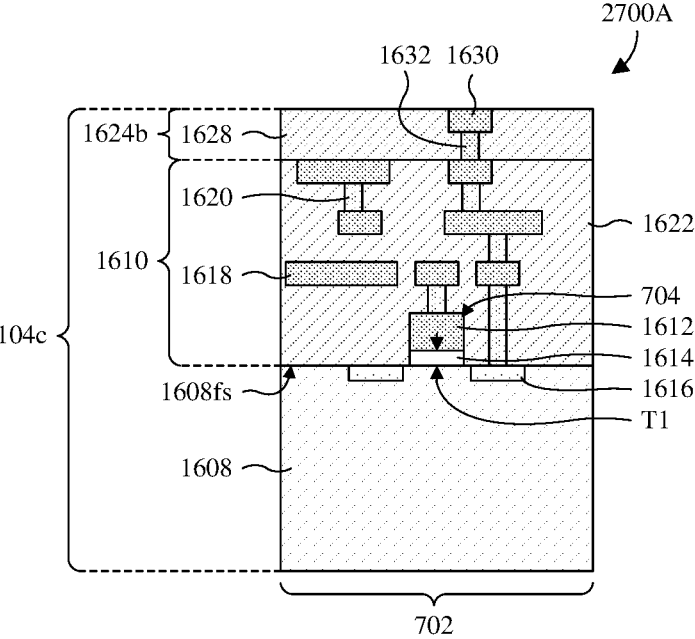
Figure 27B:
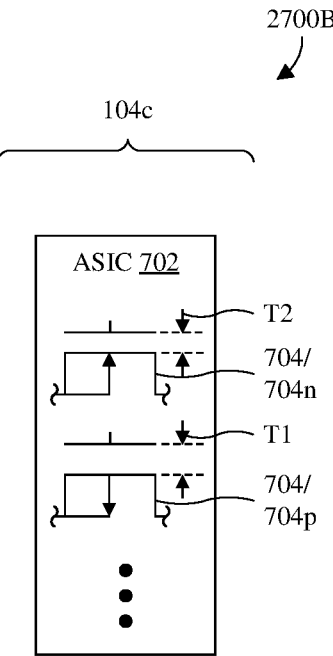

As illustrated by the views of FIGS. 26, 27A, and 27B, a third IC chip 104c comprising an ASIC 702 is formed. The ASIC 702 has only one, two, or more gate dielectric thickness, each of which is less than or equal to a minimum gate dielectric thickness amongst the only one, two, or more gate dielectric thicknesses that the pixel sensor 102. For example, the ASIC 702 has only two or more gate dielectric thicknesses, including the first gate dielectric thickness T1, at the third IC chip 104c.

As illustrated by the cross-sectional view 2600 of FIG. 26, a plurality of third transistors 704 is formed on a frontside 1608fs of a third semiconductor substrate 1608. Note that only one of the third transistors 704 is shown. Note that only one of the third transistors 704 is shown. However, additional third transistors are shown hereafter in FIG. 27B. The third transistors 704 comprise individual third gate electrodes 1612, individual third gate dielectric layers 1614, and individual pairs of third source/drain regions 1616. The third gate electrodes 1612 are stacked respectively with the third gate dielectric layers 1614, which separate the third gate electrodes 1612 from the third semiconductor substrate 1608. Further, the third gate dielectric layers 1614 each have a thickness less than or equal to a minimum gate dielectric thickness that the pixel sensor 102 has at the second IC chip 104b. For example, the third gate dielectric layer 1614 of the illustrated third transistor 704 may have the first gate dielectric thickness T1. The pairs of third source/drain regions 1616 are in the third semiconductor substrate 1608, and each of the third gate electrodes 1612 is between the third source/drain regions of a respective pair of third source/drain regions 1616.

As illustrated by a cross-sectional view 2700A of FIG. 27A, and a circuit diagram 2700B of FIG. 27B, a third interconnect structure 1610 and a fourth bond substructure 1624b are formed stacked over and electrically coupled to the third transistors 704. The third interconnect structure 1610 comprises a plurality of third conductive wires 1618 and a plurality of third conductive vias 1620 in a third interconnect dielectric layer 1622. The third conductive wires 1618 and the third conductive vias 1620 are grouped respectively into a plurality of third wire levels and a plurality of third via levels that are alternatingly stacked to define conductive paths. The fourth bond substructure 1624b overlies the third interconnect structure 1610 and is as the third bond substructure 1624a is described, except that the second bond via 1632 extends from the second bond pad 1630 to the third interconnect structure 1610.

Focusing on the circuit diagram 2700B of FIG. 27B, the plurality of third transistors 704 comprises at least one n-type transistor 704n and at least one p-type transistor 704p. Note that the ellipses at the ASIC 702 is used to represent zero or more additional third transistors. Further, the n-type and p-type transistors 704n, 704p respectively have the second and first gate dielectric thicknesses T2, T1.

Figure 28A:
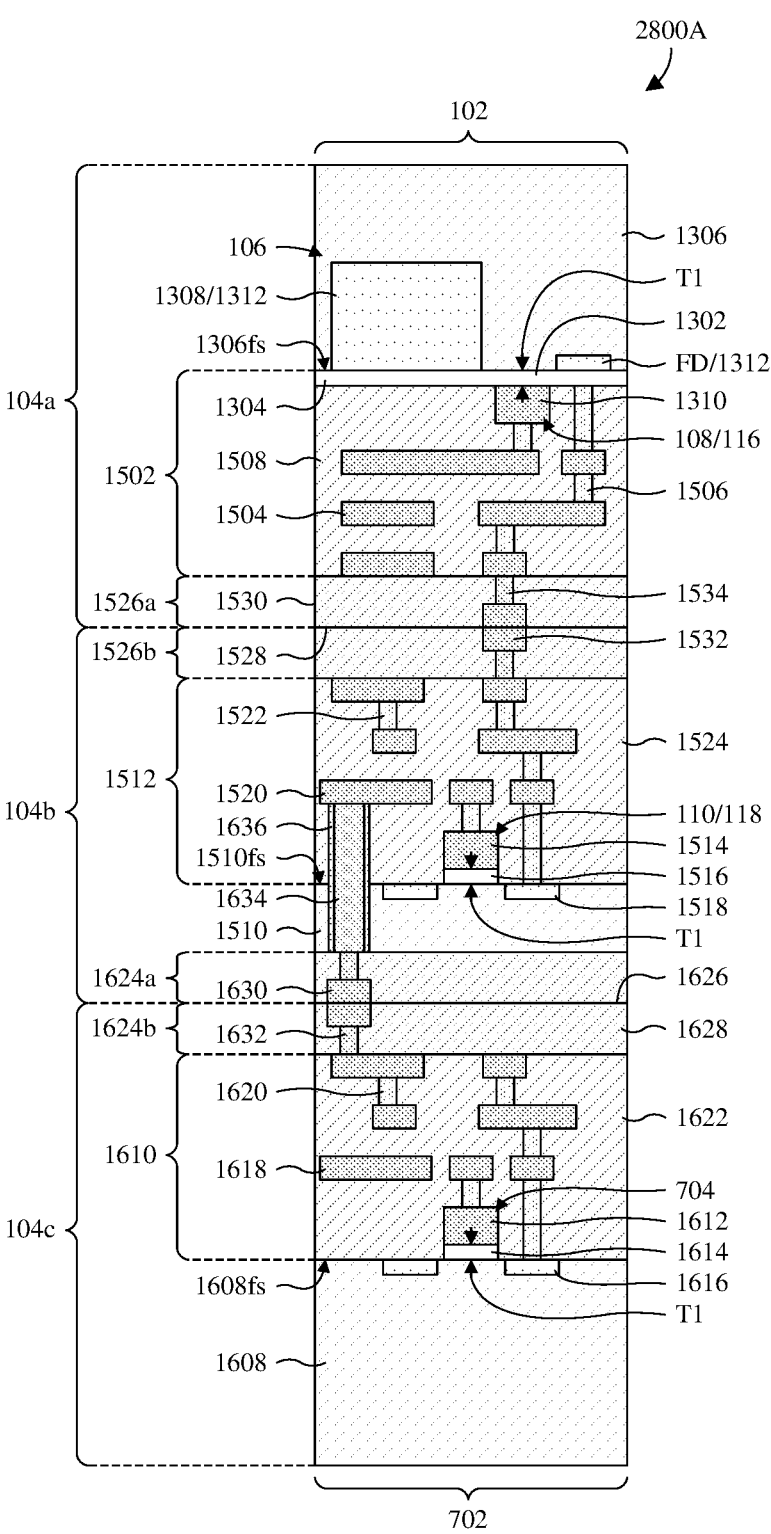
Figure 28B:
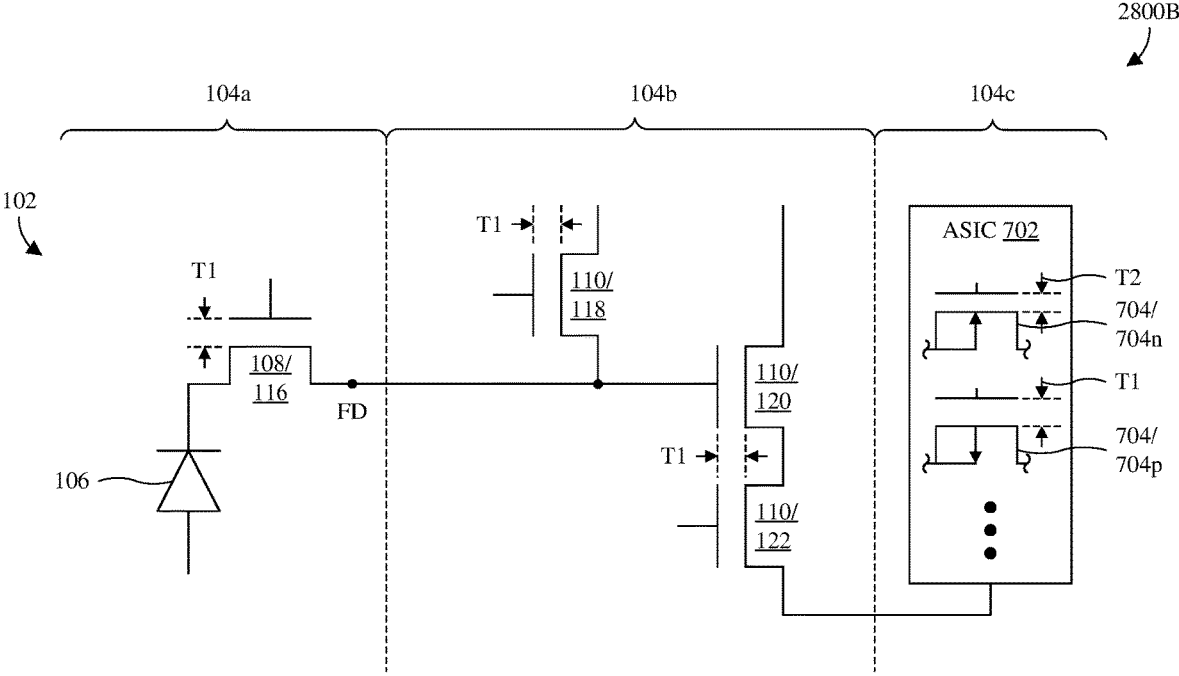

As illustrated by a cross-sectional view 2800A of FIG. 28A, and a circuit diagram 2800B of FIG. 28B, the structure of FIG. 25 is vertically flipped and is bonded to the third IC chip 104c of FIGS. 27A and 27B at a second bond interface 1626. The bonding electrically couples the pixel sensor 102 to the ASIC 702.

Figure 29:
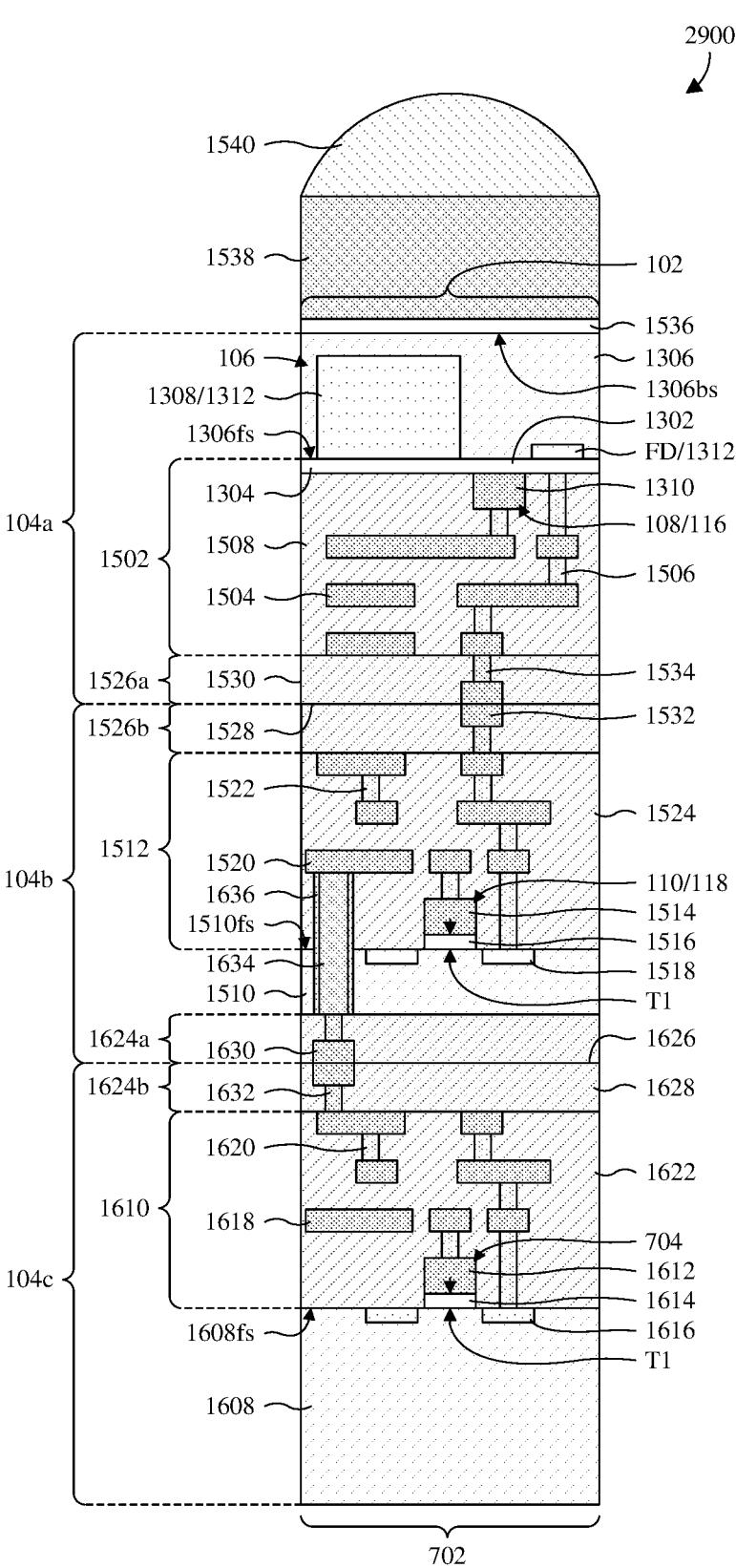

As illustrated by a cross-sectional view 2900 of FIG. 29, the first semiconductor substrate 1306 is thinned from a backside 1306bs of the first semiconductor substrate 1306. The thinning may, for example, be performed by a CMP or the like.

Also illustrated by the cross-sectional view 2900 of FIG. 29, a backside passivation layer 1536, a color filter 1538, and a micro lens 1540 are formed stacked over the first IC chip 104a on the backside 1306bs of the first semiconductor substrate 1306. The backside passivation layer 1536 is dielectric and transparent to incident radiation. The color filter 1538 is between the backside passivation layer 1536 and the micro lens 1540. Further, the color filter 1538 is configured to transmit first color wavelengths while blocking second color wavelengths. The micro lens 1540 is configured to focus incident radiation on the photodetector 106.

While FIGS. 18, 19A, 19B, 20, 21, 22A, 22B, 23A, 23B, 24-26, 27A, 27B, 28A, 28B, and 29 are described with reference to a method, it will be appreciated that the structures shown in these figures are not limited to the method but rather may stand alone separate of the method. While FIGS. 18, 19A, 19B, 20, 21, 22A, 22B, 23A, 23B, 24-26, 27A, 27B, 28A, 28B, and 29 are described as a series of acts, it will be appreciated that the order of the acts may be altered in other embodiments. While FIGS. 18, 19A, 19B, 20, 21, 22A, 22B, 23A, 23B, 24-26, 27A, 27B, 28A, 28B, and 29 illustrate and describe as a specific set of acts, some acts that are illustrated and/or described may be omitted in other embodiments. Further, acts that are not illustrated and/or described may be included in other embodiments.

While FIGS. 18, 19A, 19B, 20, 21, 22A, 22B, 23A, 23B, 24-26, 27A, 27B, 28A, 28B, and 29 illustrate formation of the image sensor with certain gate dielectric thicknesses, other gate dielectric thicknesses are amenable. For example, the gate dielectric thicknesses of the first, second, and third IC chips 104a-104c may alternatively be formed according to any of the embodiments described above, such as those embodiments described with regard to FIGS. 1, 2, 3A-3C, 4-8, 9A-9D, 10-13, 14A-14D, 15, 16A-16C, and 17. Further, while FIGS. 18, 19A, 19B, 20, 21, 22A, 22B, 23A, 23B, 24-26, 27A, 27B, 28A, 28B, and 29 illustrate formation of a single pixel sensor 102 of the image sensor, it is to be appreciated that multiple instances of the pixel sensor 102 may be concurrently formed. These multiple instances may, for example, be formed in a grid pattern as seen at, for example, FIGS. 10-12.

With reference to FIG. 30, a block diagram 3000 of some embodiments of the method of FIGS. 18, 19A, 19B, 20, 21, 22A, 22B, 23A, 23B, 24-26, 27A, 27B, 28A, 28B, and 29 is provided.

At 3002, a first IC chip comprising a first portion of a pixel sensor is formed, where the first portion of the pixel sensor has only one gate dielectric thickness. See, for example, FIGS. 18, 19A, 19B, and 20. Such forming may, for example, include: 1) at 3002a, forming a photodetector in a first semiconductor substrate (see, e.g., FIG. 18); 2) at 3002b, depositing a protection layer and a first gate electrode layer covering a frontside of the first semiconductor substrate (see, e.g., FIG. 18); 3) at 3002c, patterning the first gate electrode layer to form a first transistor adjoining the photodetector and having the only gate dielectric thickness (see, e.g., FIGS. 19A and 19B); and 4) at 3002d, forming a first interconnect structure covering and electrically coupled to the first transistor (see, e.g., FIG. 20).

At 3004, a second IC chip comprising a second portion of the pixel sensor is formed, where the second portion of the pixel sensor comprises a plurality of second transistors and has only one, two, or more gate dielectric thicknesses, each of which is less than or equal to the only one gate dielectric thickness that the first portion of the pixel sensor has. See, for example, FIGS. 21, 22A, and 22B.

At 3006, the first and second IC chips are bonded together at a first bond interface. See, for example, FIGS. 23A and 23B.

At 3008, at TSV is formed extending through a second semiconductor substrate of the second IC chip to a second interconnect structure of the second IC chip that is on a frontside of the second semiconductor structure. See, for example, FIG. 24.

At 3010, a bond structure is formed covering and electrically coupled to the TSV on a backside of the second semiconductor structure. See, for example, FIG. 25.

At 3012, a third IC chip comprising an ASIC is formed, where the ASIC comprises a plurality of third transistors and has only one, two, or more gate dielectric thicknesses, each of which is less than or equal to each of the only one, two, or more gate dielectric thicknesses that the second portion of the pixel sensor has. See, for example, FIGS. 26, 27A, and 27B.

At 3014, the second and third IC chips are bonded together at a second bond interface. See, for example, FIGS. 28A and 28B.

At 3016, the first semiconductor substrate is thinned from a backside of the first semiconductor substrate. See, for example, FIG. 29.

At 3018, a backside passivation layer, a color filter, and a microlens are formed stacked over the first IC chip on the backside of the first semiconductor substrate. See, for example, FIG. 29.

While the block diagram 3000 of FIG. 3000 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor including: a first IC chip; a second IC chip stacked with the first IC chip; and a pixel sensor spanning the first and second IC chips, wherein the pixel sensor includes a first transistor and a photodetector in the first IC chip, and further includes a plurality of second transistors in the second IC chip; wherein the first transistor includes a gate dielectric layer with a first thickness, and where the second transistors include individual gate dielectric layers with second thicknesses less than or equal to the first thickness. In some embodiments, the pixel sensor is a 4T APS. In some embodiments, the pixel sensor has only one transistor in the first IC chip and has only three or more transistors in the second IC chip. In some embodiments, each of the second thicknesses is less than the first thickness. In some embodiments, the plurality of second transistors includes a reset transistor, a source-follower transistor, and a select transistor, wherein the source-follower transistor and the select transistor are electrically coupled in series, and wherein a gate electrode of the source-follower transistor is electrically shorted to a source/drain region of the reset transistor and a source/drain region of the first transistor. In some embodiments, the pixel sensor repeats in a plurality of rows and a plurality of columns, and wherein repetitions of the pixel sensor are non-overlapping. In some embodiments, the pixel sensor has only one photodetector. In some embodiments, the pixel sensor has a plurality of photodetectors, including the photodetector, and a plurality of first transistors, including the first transistor, and wherein the first transistors correspond to the photodetectors with a one-to-one correspondence and are electrically coupled to a common node.

In some embodiments, the present disclosure provides another image sensor including: a first semiconductor substrate; a photodetector and a first transistor adjoining on the first semiconductor substrate; a second semiconductor substrate; a plurality of second transistors on the second semiconductor substrate; a third semiconductor substrate stacked with the first and second semiconductor substrates, such that the second semiconductor substrate is between and spaced from the first and third semiconductor substrates; and a plurality of third transistors on the third semiconductor substrate; wherein the photodetector and the first and second transistors form a pixel sensor, and wherein each gate dielectric thickness of the second transistors is inclusively between a gate dielectric thickness of the first transistor and a maximum gate dielectric thickness amongst the third transistors. In some embodiments, the third transistors form an ASIC electrically coupled to the pixel sensor. In some embodiments, each gate dielectric thickness of the second transistors is less than the gate dielectric thickness of the first transistor. In some embodiments, the maximum gate dielectric thickness amongst the third transistors is less than each gate dielectric thickness of the second transistors. In some embodiments, the pixel sensor has only two different gate dielectric thickness at the second semiconductor substrate. In some embodiments, the plurality of second transistors includes a source-follower transistor, wherein a gate electrode of the source-follower transistor is electrically shorted to a source/drain region of the first transistor, wherein a gate dielectric thickness of the source-follower transistor is less than the gate dielectric thickness of the first transistor.

In some embodiments, the present disclosure provides a method for forming an image sensor, the method including: forming a first IC chip, wherein the forming includes: forming a photodetector in a first substrate; forming a first transistor on the first substrate, adjacent to the photodetector, wherein the photodetector and the first transistor form a first pixel-sensor portion; forming a first interconnect structure covering the first transistor and the photodetector, and further electrically coupled to first transistor; forming a second IC chip, wherein the second IC chip includes: forming a plurality of second transistors on a second substrate, wherein the second transistors form a second pixel-sensor portion; and forming a second interconnect structure covering and electrically coupled to the second transistors; and bonding the first and second IC chips together such that the first and second pixel-sensor portions are stacked and electrically coupled together to form a pixel sensor; wherein the first transistor includes a gate dielectric layer with a first thickness, and wherein the second transistors include individual gate dielectric layers with second thicknesses less than or equal to the first thickness. In some embodiments, the forming of the first transistor includes: depositing a dielectric protection layer covering the photodetector and having the first thickness; depositing a gate electrode layer covering the dielectric protection layer; and patterning the gate electrode layer to form a gate electrode separated from the first substrate by the dielectric protection layer; wherein the dielectric protection layer persists at covering the photodetector after the bonding. In some embodiments, the bonding is performed by bonding in which metal pads respectively of the first and second IC chips are bonded together at an interface and dielectric layers respectively of the first and second IC chips are bonded together at the interface. In some embodiments, the first thickness extends from a gate electrode of the first transistor to the first substrate. In some embodiments, the method further includes: forming a third IC chip, wherein the third IC chip includes: forming a plurality of third transistors on a third substrate, wherein the third transistors include individual gate dielectric layers with third thicknesses less than or equal to each of the first and second thicknesses; and forming a third interconnect structure covering the third transistors, wherein the third transistors and the third interconnect structure form an ASIC; and bonding the second and third IC chips together, such that the second IC chip is between the first and third IC chips and such that the ASIC is electrically coupled to the pixel sensor. In some embodiments, the forming of the first IC chip includes forming multiple instances of the first pixel-sensor portion arranged in a grid pattern, wherein the forming of the second IC chip includes forming multiple instances of the second pixel-sensor portion arranged in a grid pattern, and wherein the multiple instances of the second pixel-sensor portion correspond to the multiple instances of the first pixel-sensor portion with a one-to-one correspondence.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a first integrated circuit (IC) chip, wherein the forming comprises:
        forming a photodetector in a first substrate;

forming a first transistor on the first substrate, adjacent to the photodetector, wherein the photodetector and the first transistor form a first pixel-sensor portion, and wherein the forming of the first transistor comprises:
            depositing a dielectric protection layer covering the photodetector and having a first thickness;
            depositing a gate electrode layer covering the dielectric protection layer; and
            patterning the gate electrode layer to form a gate electrode separated from the first substrate by the dielectric protection layer; and
        forming a first interconnect structure covering the first transistor and the photodetector, and further electrically coupled to the first transistor;
    forming a second IC chip, wherein the second IC chip comprises:
        forming a plurality of second transistors on a second substrate, wherein the plurality of second transistors form a second pixel-sensor portion; and
        forming a second interconnect structure covering and electrically coupled to the plurality of second transistors; and
        bonding the first and second IC chips together such that the first and second pixel-sensor portions are stacked and electrically coupled together to form a pixel sensor;
    wherein the dielectric protection layer persists at covering the photodetector after the bonding, wherein the first transistor comprises a gate dielectric layer with the first thickness and corresponding to a portion of the dielectric protection layer, and wherein the plurality of second transistors comprise individual gate dielectric layers with second thicknesses less than or equal to the first thickness.

2. The method according to claim 1, wherein the bonding is performed by bonding in which metal pads respectively of the first and second IC chips are bonded together at an interface and dielectric layers respectively of the first and second IC chips are bonded together at the interface.

3. The method according to claim 1, wherein the first thickness extends from the gate electrode of the first transistor to the first substrate.

4. The method according to claim 1, further comprising:
    forming a third IC chip, wherein the third IC chip comprises:
        forming a plurality of third transistors on a third substrate, wherein the plurality of third transistors comprise individual gate dielectric layers with third thicknesses less than or equal to each of the first and second thicknesses; and
        forming a third interconnect structure covering the plurality of third transistors, wherein the plurality of third transistors and the third interconnect structure form an application-specific integrated circuit (ASIC); and
        bonding the second and third IC chips together, such that the second IC chip is between the first and third IC chips and such that the ASIC is electrically coupled to the pixel sensor.

5. The method according to claim 1, wherein the forming of the first IC chip comprises forming multiple instances of the first pixel-sensor portion arranged in a grid pattern, wherein the forming of the second IC chip comprises forming multiple instances of the second pixel-sensor portion arranged in a grid pattern, and wherein the multiple instances of the second pixel-sensor portion correspond to the multiple instances of the first pixel-sensor portion with a one-to-one correspondence.

6. The method according to claim 1, wherein the second thicknesses are the same as each other and are less than the first thickness.

7. A method for forming an image sensor, the method comprising:

forming a first integrated circuit (IC) chip that comprises a first pixel-sensor portion, wherein the first pixel-sensor portion comprises a photodetector in a first substrate, a first transistor adjoining the photodetector on a first side of the first substrate, and a dielectric protection layer covering the photodetector on the first side and separating a gate electrode of the first transistor from the first substrate;

forming a second IC chip that comprises a second pixel-sensor portion, wherein the second pixel-sensor portion comprises a plurality of second transistors;

bonding the first and second IC chips together, such that the first and second pixel-sensor portions are stacked and electrically coupled together to form a pixel sensor;

forming a third IC chip that comprises an application-specific integrated circuit (ASIC), wherein the ASIC comprises a plurality of third transistors; and bonding the second and third IC chips together, such that the second IC chip is between the first and third IC chips and such that the ASIC is electrically coupled to the pixel sensor, wherein the dielectric protection layer persists, after the bonding of the second and third IC chips together, at covering the photodetector on the first side of the first substrate and at separating the gate electrode of the first transistor from the first substrate, wherein the first transistor has a first gate dielectric thickness that corresponds to a thickness of the dielectric protection layer, wherein the plurality of second transistors share a second gate dielectric thickness different than the first gate dielectric thickness, and wherein a transistor of the plurality of third transistors has a third gate dielectric thickness less than the second gate dielectric thickness.

8. The method according to claim 7, wherein the second IC chip comprises a second substrate on which the second pixel-sensor portion is arranged, and wherein the method further comprises:

forming a through substrate via (TSV) extending through the second substrate between the bonding of the first and second IC chips together and the bonding of the second and third IC chips together.

9. The method according to claim 7, wherein another transistor of the second pixel-sensor portion has the first gate dielectric thickness, and wherein another transistor of the ASIC has the second gate dielectric thickness.

10. The method according to claim 7, wherein another transistor of the ASIC has a fourth gate dielectric thickness less than the third gate dielectric thickness.

11. The method according to claim 7, wherein the forming of the first IC chip comprises forming the gate electrode of the first transistor inset into the first substrate.

12. The method according to claim 7, wherein the pixel sensor is a four transistor (4T) active pixel sensor (APS).

13. The method according to claim 7, wherein the plurality of second transistors comprise a reset transistor, a source-follower transistor, and a select transistor.

14. The method according to claim 7, wherein the second gate dielectric thickness is less than the first gate dielectric thickness.

15. The method according to claim 7, wherein the gate electrode of the first transistor borders a first side of the photodetector, and wherein the dielectric protection layer extends from the gate electrode to a second side of the photodetector that is opposite the first side of the photodetector with the thickness of the dielectric protection layer being substantially uniform.

16. A method, comprising:

forming a first IC chip comprising:
a photodetector in a first semiconductor substrate;
a first transistor that borders the photodetector;
an interconnect structure overlying and electrically coupled to the first transistor; and
a dielectric protection layer that separates the interconnect structure from the photodetector and that separates a gate electrode of the first transistor from the first semiconductor substrate;

forming a plurality of second transistors on a second semiconductor substrate;

vertically stacking the first and second semiconductor substrates;

forming a plurality of third transistors on a third semiconductor substrate; and vertically stacking the third semiconductor substrate with the first and second semiconductor substrates, such that the second semiconductor substrate is between and spaced from the first and third semiconductor substrates, wherein the photodetector, the first transistor, and the plurality of second transistors form a pixel sensor, wherein the dielectric protection layer, after the vertical stacking of the first and second semiconductor substrates, persists at separating the interconnect structure from the photodetector and at separating the gate electrode from the first semiconductor substrate, wherein each gate dielectric thickness of the plurality of second transistors is inclusively between a gate dielectric thickness of the first transistor and a maximum gate dielectric thickness amongst the plurality of third transistors, and wherein each gate dielectric thickness of the plurality of second transistors is less than the gate dielectric thickness of the first transistor, which corresponds to a thickness of the dielectric protection layer.

17. The method according to claim 16, wherein the plurality of third transistors form an application-specific integrated circuit (ASIC) electrically coupled to the pixel sensor.

18. The method according to claim 16, wherein the maximum gate dielectric thickness amongst the plurality of third transistors is less than each gate dielectric thickness of the plurality of second transistors.

19. The method according to claim 16, wherein the plurality of second transistors comprises a source-follower transistor, wherein a gate electrode of the source-follower transistor is electrically shorted to a source/drain region of the first transistor, and wherein a gate dielectric thickness of the source-follower transistor is less than the gate dielectric thickness of the first transistor.

20. The method according to claim 16, wherein the dielectric protection layer extends along an entire width of the photodetector with the thickness of the dielectric protection layer being substantially uniform and equal to the gate dielectric thickness of the first transistor.

* * * * *